(12) United States Patent
Chang et al.

(10) Patent No.: US 10,950,728 B2
(45) Date of Patent: Mar. 16, 2021

(54) FIN FIELD EFFECT TRANSISTOR (FINFET) DEVICE STRUCTURE WITH ISOLATION LAYER AND METHOD FOR FORMING THE SAME

(71) Applicant: Taiwan Semiconductor Manufacturing Co., Ltd., Hsinchu (TW)

(72) Inventors: Chung-Huai Chang, Taichung (TW); Chao-Hsun Wang, Taoyuan (TW); Kuo-Yi Chao, Hsinchu (TW); Mei-Yun Wang, Chupei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/964,742

(22) Filed: Apr. 27, 2018

(65) Prior Publication Data

US 2019/0148537 A1    May 16, 2019

Related U.S. Application Data

(60) Provisional application No. 62/586,968, filed on Nov. 16, 2017.

(51) Int. Cl.
*H01L 21/768* (2006.01)
*H01L 29/78* (2006.01)
(Continued)

(52) U.S. Cl.
CPC ...... *H01L 29/785* (2013.01); *H01L 21/76838* (2013.01); *H01L 21/76847* (2013.01);
(Continued)

(58) Field of Classification Search
CPC ... H01L 29/66795–66818; H01L 29/785–792; H01L 21/823431;
(Continued)

(56) References Cited

U.S. PATENT DOCUMENTS

| 9,147,748 | B1 * | 9/2015 | Xie | H01L 29/66545 |
| 2002/0140101 | A1 * | 10/2002 | Yang | H01L 21/76802 |
| | | | | 257/762 |
| 2013/0049219 | A1 * | 2/2013 | Tsai | H01L 21/28518 |
| | | | | 257/774 |
| 2014/0103404 | A1 * | 4/2014 | Li | H01L 21/82384 |
| | | | | 257/288 |

(Continued)

*Primary Examiner* — Matthew C Landau
*Assistant Examiner* — Eric K Ashbahian
(74) *Attorney, Agent, or Firm* — Birch, Stewart, Kolasch & Birch, LLP

(57) ABSTRACT

A FinFET device structure is provided. The FinFET device structure includes a gate structure formed over a fin structure and an S/D contact structure formed over the fin structure. The FinFET device structure also includes an S/D conductive plug formed over the S/D contact structure, and the S/D conductive plug includes a first barrier layer and a first conductive layer. The FinFET device structure includes a gate contact structure formed over the gate structure, and the gate contact structure includes a second barrier layer and a second conductive layer. The FinFET device structure includes a first isolation layer surrounding the S/D conductive plug, and the first barrier layer is between the first isolation layer and the first conductive layer. A second isolation layer surrounding the gate contact structure, and the second barrier layer is between the second isolation layer and the second conductive layer.

20 Claims, 26 Drawing Sheets

(51) Int. Cl.
  *H01L 29/66* (2006.01)
  *H01L 29/08* (2006.01)
  *H01L 29/06* (2006.01)
  *H01L 21/8238* (2006.01)

(52) U.S. Cl.
  CPC .. *H01L 21/823828* (2013.01); *H01L 29/0649* (2013.01); *H01L 29/0847* (2013.01); *H01L 29/66545* (2013.01); *H01L 29/66795* (2013.01); *H01L 29/665* (2013.01); *H01L 29/7848* (2013.01)

(58) Field of Classification Search
  CPC ......... H01L 21/823821; H01L 27/0886; H01L 29/66545; H01L 21/76897; H01L 21/76847; H01L 23/5226; H01L 29/0649; H01L 29/0847; H01L 21/76838; H01L 21/823828
  See application file for complete search history.

(56) References Cited

U.S. PATENT DOCUMENTS

| | | | |
|---|---|---|---|
| 2014/0199837 A1* | 7/2014 | Hung | H01L 21/76816 438/675 |
| 2014/0361375 A1* | 12/2014 | Deniz | H01L 21/283 257/369 |
| 2015/0380305 A1* | 12/2015 | Basker | H01L 21/76846 257/77 |
| 2016/0064517 A1* | 3/2016 | Su | H01L 29/4966 438/586 |
| 2016/0064518 A1* | 3/2016 | Liu | H01L 29/66545 438/586 |
| 2017/0148799 A1* | 5/2017 | Basker | H01L 21/76897 |
| 2018/0076086 A1* | 3/2018 | Clevenger | H01L 21/76897 |
| 2018/0096934 A1* | 4/2018 | Siew | H01L 21/76829 |
| 2018/0130704 A1* | 5/2018 | Li | H01L 21/02164 |
| 2018/0342618 A1* | 11/2018 | Chen | H01L 21/76897 |

* cited by examiner

FIN FIELD EFFECT TRANSISTOR (FINFET) DEVICE STRUCTURE WITH ISOLATION LAYER AND METHOD FOR FORMING THE SAME

CROSS REFERENCE TO RELATED APPLICATIONS

This Application claims the benefit of U.S. Provisional Application No. 62/586,968, filed on Nov. 16, 2017, and entitled "Fin field effect transistor (FinFET) device structure and method for forming the same", the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

As the semiconductor industry has progressed into nanometer technology process nodes in pursuit of higher device density, higher performance, and lower costs, challenges from both fabrication and design issues have resulted in the development of three-dimensional designs, such as the fin field effect transistor (FinFET). FinFETs are fabricated with a thin vertical "fin" (or fin structure) extending from a substrate. The channel of the FinFET is formed in this vertical fin. A gate is provided over the fin. The advantages of a FinFET may include reducing the short channel effect and providing a higher current flow.

Although existing FinFET devices and methods of fabricating FinFET devices have generally been adequate for their intended purpose, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 1A-1L show perspective representations of various stages of forming a FinFET device structure, in accordance with some embodiments of the disclosure.

DETAILED DESCRIPTION

Figure 1A:
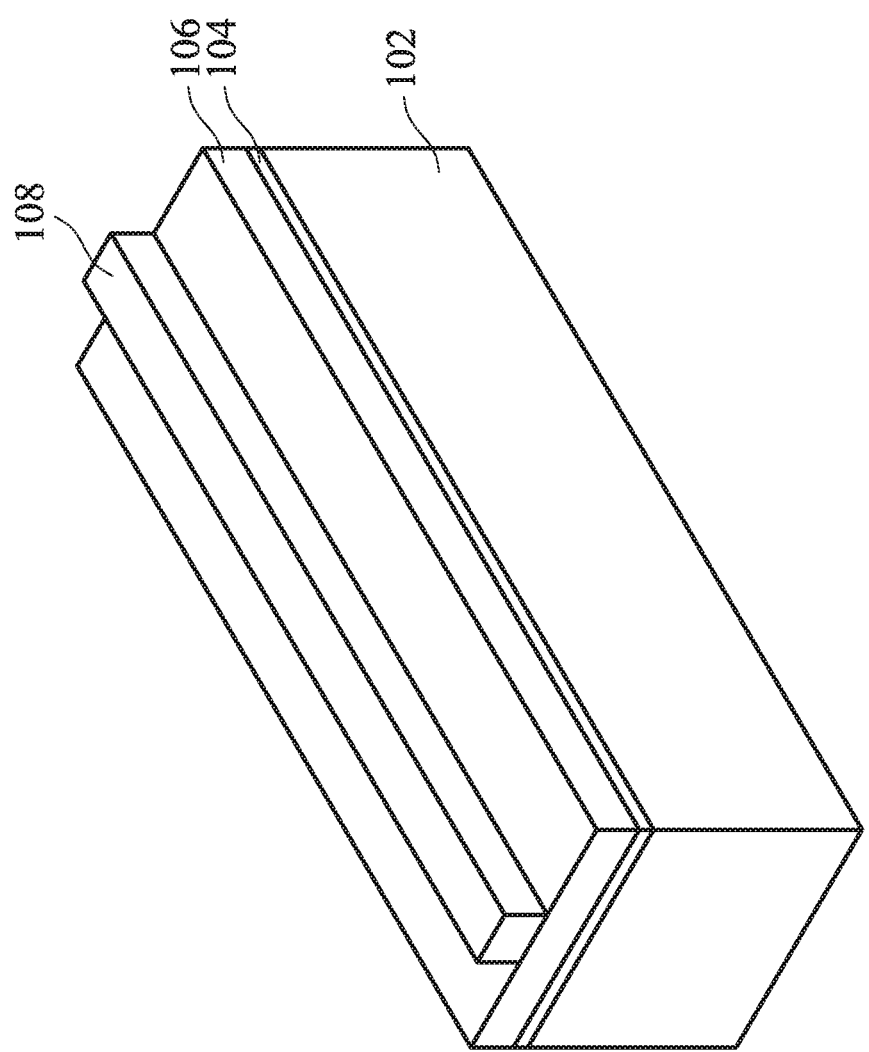

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-alignment process. The sacrificial layer is then removed, and the remaining spacers may then be used to pattern the fins.

Embodiments for forming a fin field effect transistor (FinFET) device structure are provided. FIGS. 1A-1L show perspective representations of various stages of forming a FinFET device structure 100a, in accordance with some embodiments of the disclosure.

Referring to FIG. 1A, a substrate 102 is provided. The substrate 102 may be made of silicon or other semiconductor materials. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 has an epitaxial layer overlying a bulk semiconductor.

Afterwards, a dielectric layer 104 and a mask layer 106 are formed over the substrate 102, and a photoresist layer 108 is formed over the mask layer 106. The photoresist layer 108 is patterned by a patterning process. The patterning process includes a photolithography process and an etching process. The photolithography process includes photoresist coating (e.g., spin-on coating), soft baking, mask aligning, exposure, post-exposure baking, developing the photoresist, rinsing and drying (e.g., hard baking). The etching process may include a dry etching process or a wet etching process.

The dielectric layer 104 is a buffer layer between the substrate 102 and the mask layer 106. In addition, the dielectric layer 104 is used as a stop layer when the mask layer 106 is removed. The dielectric layer 104 may be made of silicon oxide. The mask layer 106 may be made of silicon oxide, silicon nitride, silicon oxynitride, or another applicable material. In some other embodiments, more than one mask layer 106 is formed over the dielectric layer 104.

The dielectric layer 104 and the mask layer 106 are formed by deposition processes, such as a chemical vapor deposition (CVD) process, a high-density plasma chemical vapor deposition (HDPCVD) process, a spin-on process, a sputtering process, or another applicable process.

Figure 1B:
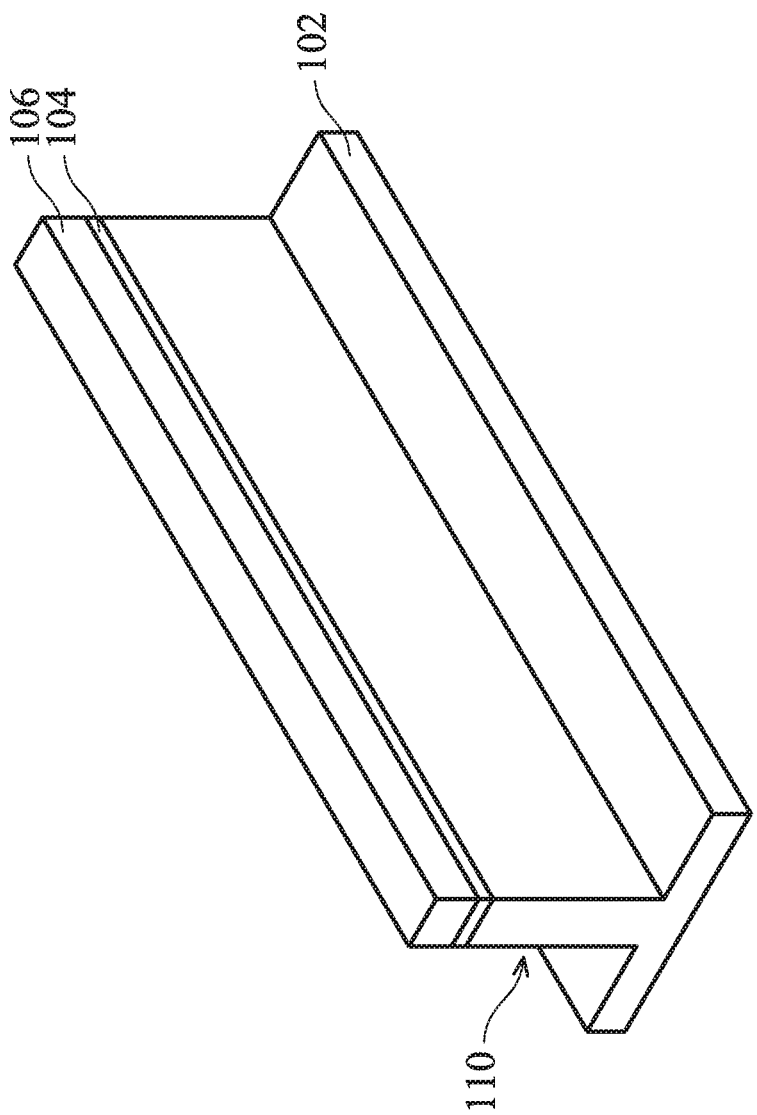

As shown in FIG. 1B, after the photoresist layer 108 is patterned, the dielectric layer 104 and the mask layer 106 are patterned by using the patterned photoresist layer 108 as a mask, in accordance with some embodiments. As a result, a patterned pad layer 104 and a patterned mask layer 106 are obtained. Afterwards, the patterned photoresist layer 108 is removed.

Next, an etching process is performed on the substrate 102 to form a fin structure 110 by using the patterned dielectric layer 104 and the patterned mask layer 106 as a mask. The etching process may be a dry etching process or a wet etching process.

In some embodiments, the substrate 102 is etched using a dry etching process. The dry etching process includes using a fluorine-based etchant gas, such as $SF_6$, $C_xF_y$, $NF_3$ or a combination thereof. The etching process may be a time-controlled process, and continue until the fin structure 110 reaches a predetermined height. In some other embodiments, the fin structure 110 has a width that gradually increases from the top portion to the lower portion.

Figure 1C:
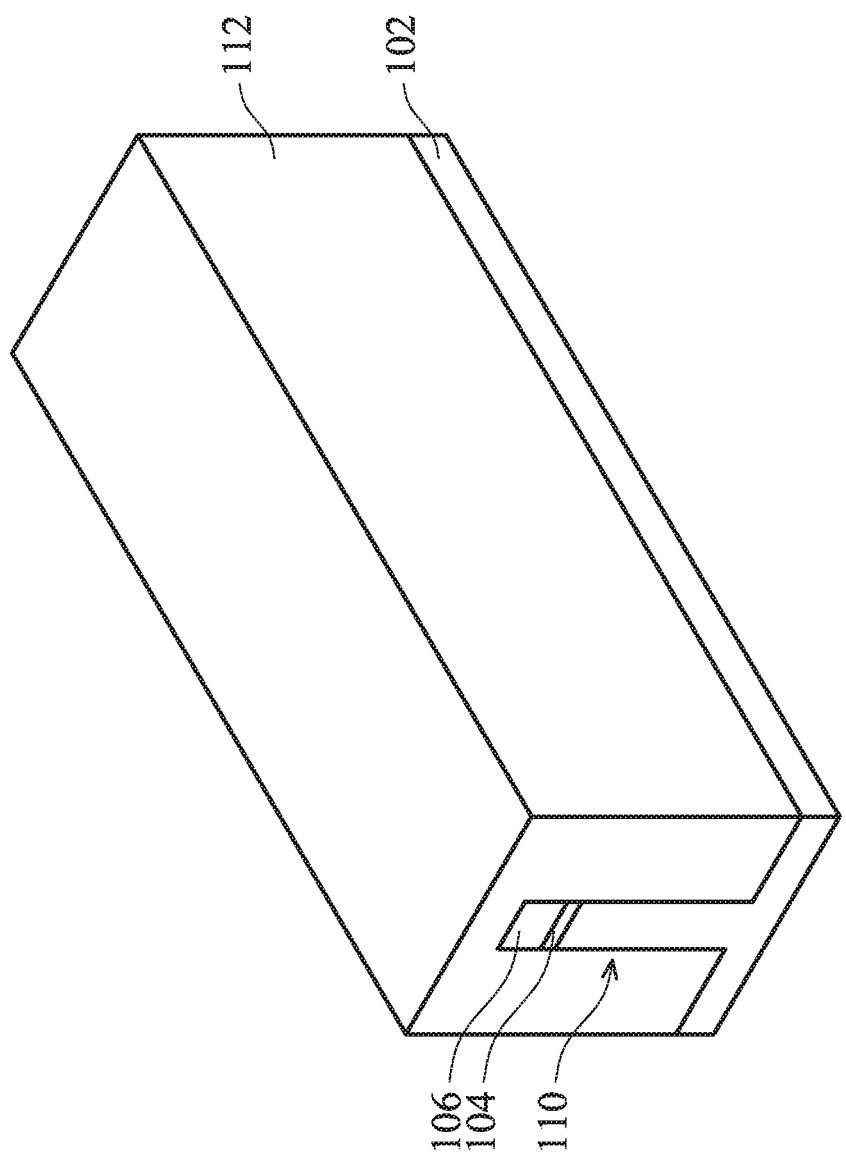

As shown in FIG. 1C, after the fin structure 110 is formed, an insulating layer 112 is formed to cover the fin structure 110 over the substrate 102, in accordance with some embodiments.

In some embodiments, the insulating layer 112 is made of silicon oxide, silicon nitride, silicon oxynitride, fluoride-doped silicate glass (FSG), or another low-k dielectric material. The insulating layer 112 may be deposited by a chemical vapor deposition (CVD) process, a spin-on-glass process, or another applicable process.

Afterwards, the insulating layer 112 is thinned or planarized to expose the top surface of the patterned mask layer 106. In some embodiments, the insulating layer 112 is thinned by a chemical mechanical polishing (CMP) process.

Afterwards, the patterned dielectric layer 104 and the patterned mask layer 106 are removed.

Figure 1D:
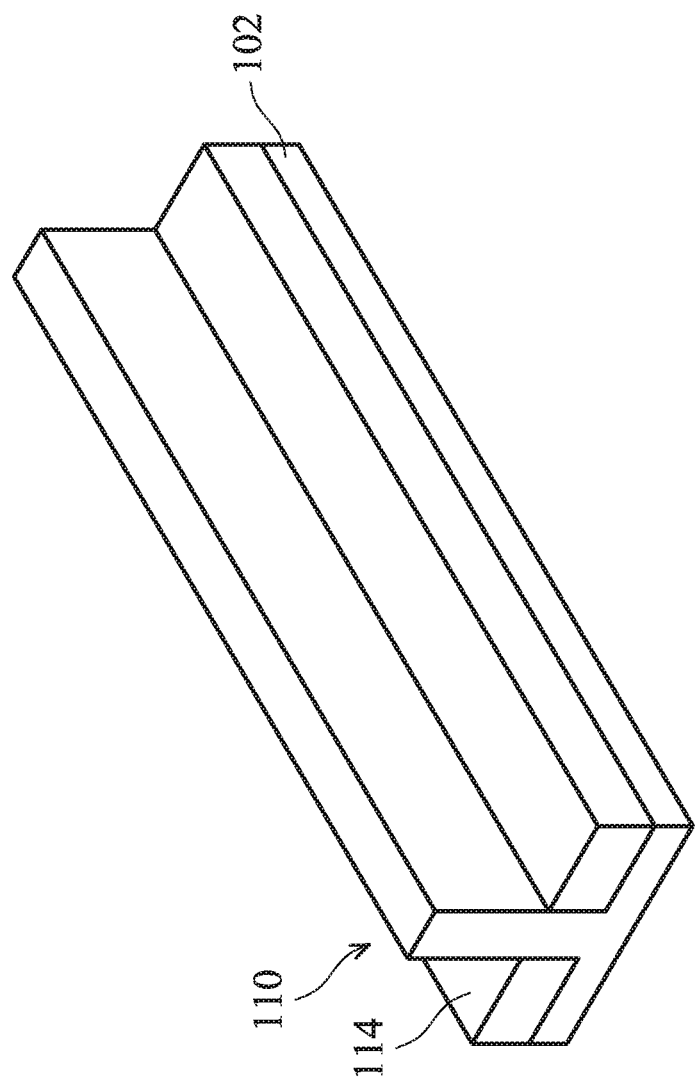

Afterwards, as shown in FIG. 1D, a portion of the insulating layer 112 is removed to form an isolation structure 114, in accordance with some embodiments. The isolation structure 114 may be a shallow trench isolation (STI) structure surrounding the fin structure 110. A lower portion of the fin structure 110 is surrounded by the isolation structure 114, and an upper portion of the fin structure 110 protrudes from the isolation structure 114. In other words, a portion of the fin structure 110 is embedded in the isolation structure 114. The isolation structure 114 prevents electrical interference and crosstalk.

Figure 1E:
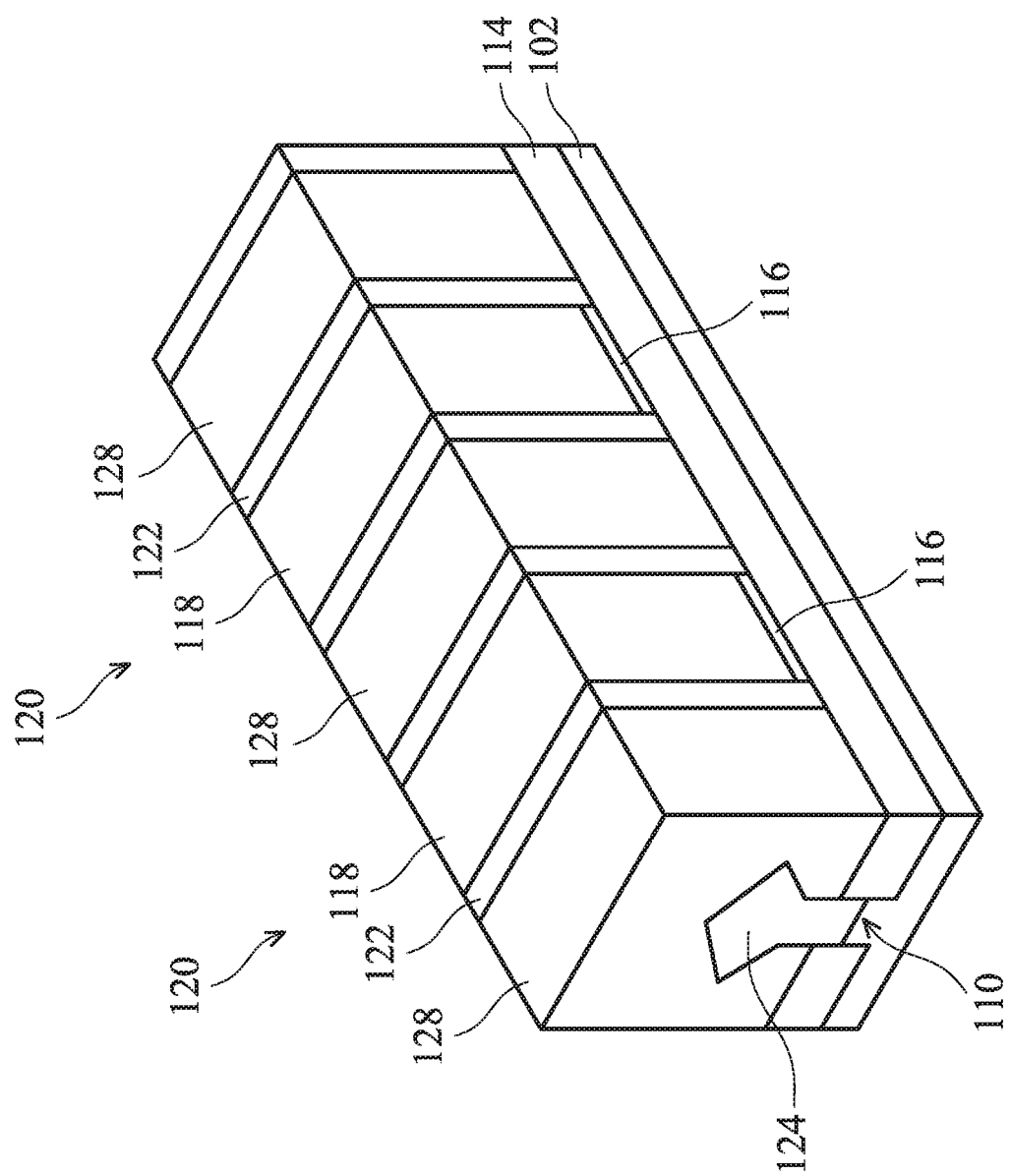

Afterwards, as shown in FIG. 1E, a dummy gate structure 120 is formed across the fin structure 110 and extends over the isolation structure 114, in accordance with some embodiments. In some embodiments, the dummy gate structure 120 includes a dummy gate dielectric layer 116 and a dummy gate electrode layer 118 formed over the dummy gate dielectric layer 116. After the dummy gate structure 120 is formed, the gate spacer layers 122 are formed on opposite sidewall surfaces of the dummy gate structure 120. The gate spacer layers 122 may be a single layer or multiple layers.

In order to improve the speed of the FinFET device structure 100, the gate spacer layers 122 are made of low-k dielectric materials. In some embodiments, the low-k dielectric materials has a dielectric constant (k value) is less than 4. Examples of low-k dielectric materials include, but are not limited to, fluorinated silica glass (FSG), carbon doped silicon oxide, amorphous fluorinated carbon, parylene, bis-benzocyclobutenes (BCB), or polyimide.

In some other embodiments, the gate spacer layers 122 are made of an extreme low-k (ELK) dielectric material with a dielectric constant (k) less than about 2.5. In some embodiments, ELK dielectric materials include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), porous SiLK, or porous silicon oxide ($SiO_2$).

Afterwards, source/drain (S/D) structures 124 are formed over the fin structure 110. In some embodiments, portions of the fin structure 110 adjacent to the dummy gate structure 120 are recessed to form recesses at two sides of the fin structure 110, and a strained material is grown in the recesses by an epitaxial (epi) process to form the S/D structures 124. In addition, the lattice constant of the strained material may be different from the lattice constant of the substrate 102. In some embodiments, the S/D structures 124 include Ge, SiGe, InAs, InGaAs, InSb, GaAs, GaSb, InAlP, InP, or the like.

After the source/drain (S/D) structures 124 are formed, a contact etch stop layer (CESL) (not shown) is formed over the substrate 102, and an inter-layer dielectric (ILD) structure 128 is formed over the contact etch stop layer. In some other embodiments, the CESL is made of silicon nitride, silicon oxynitride, and/or other applicable materials. The contact etch stop layer may be formed by plasma enhanced CVD, low-pressure CVD, ALD, or other applicable processes.

The ILD structure 128 may include multilayers made of multiple dielectric materials, such as silicon oxide, silicon nitride, silicon oxynitride, tetraethoxysilane (TEOS), phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD structure 128 may be formed by chemical vapor deposition (CVD), physical vapor deposition, (PVD), atomic layer deposition (ALD), spin-on coating, or another applicable process.

Afterwards, a polishing process is performed on the ILD structure 128 until the top surface of the dummy gate structure 120 is exposed. In some embodiments, the ILD structure 128 is planarized by a chemical mechanical polishing (CMP) process.

Figure 1F:
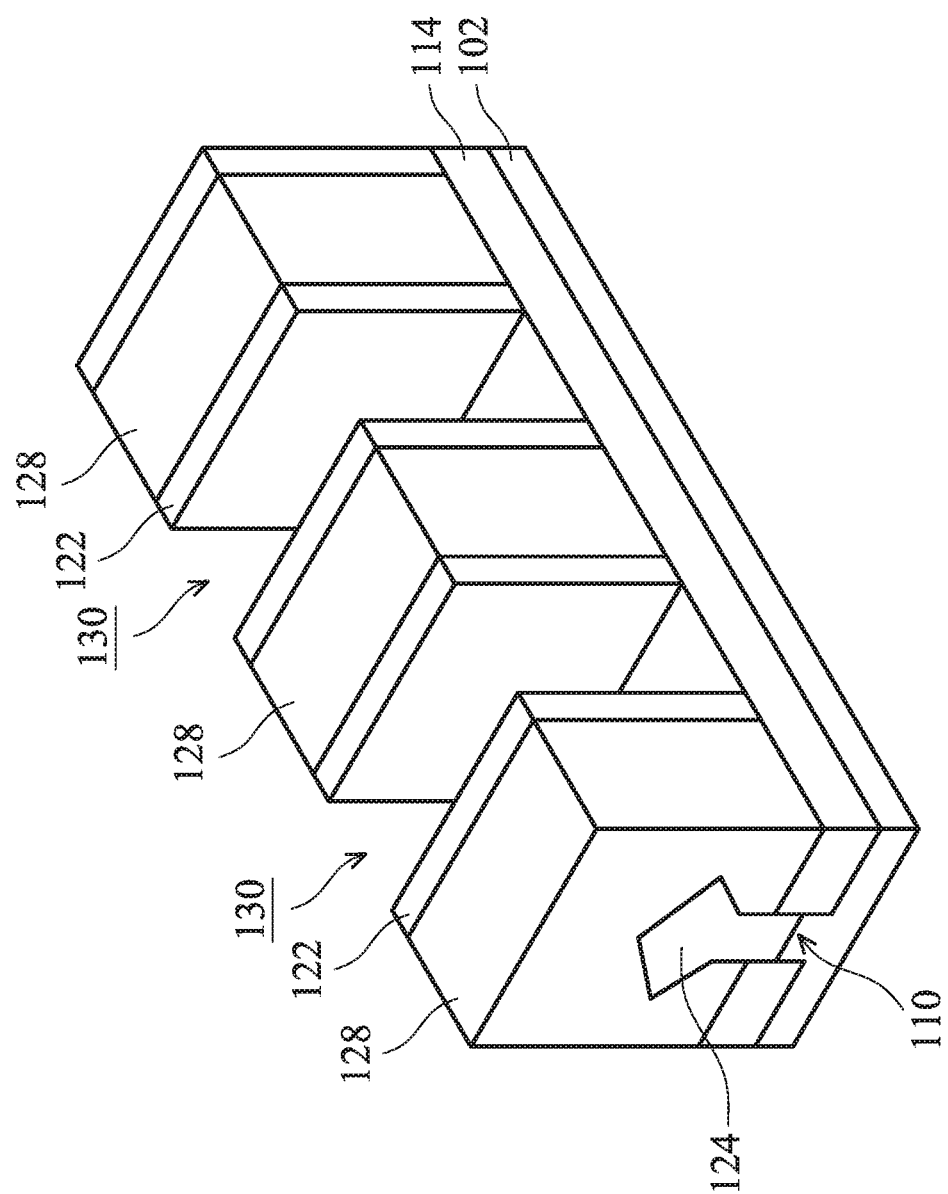

Afterwards, as shown in FIG. 1F, the dummy gate structure 120 is removed to form a trench 130 in the ILD structure 128, in accordance with some embodiments. The dummy gate dielectric layer 116 and the dummy gate electrode layer 118 are removed by an etching process, such as a dry etching process or a wet etching process.

Figure 1G:
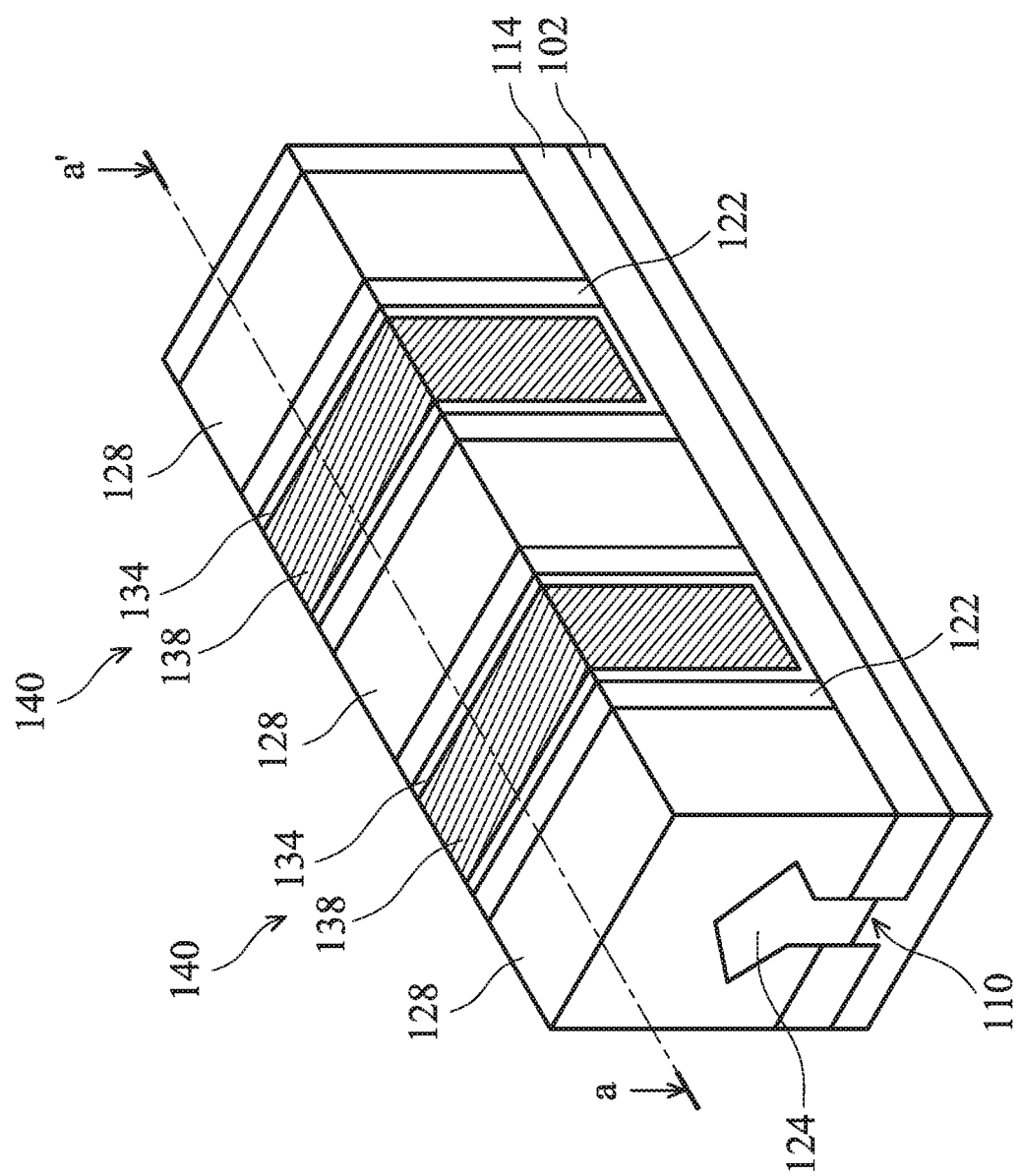

Next, as shown in FIG. 1G, a gate structure 140 is formed in the trench 130, in accordance with some embodiments. The gate structure 140 includes a gate dielectric layer 134 and a gate electrode layer 138.

The gate dielectric layer 134 may be a single layer or multiple layers. The gate dielectric layer 134 is made of silicon oxide (SiOx), silicon nitride (SixNy), silicon oxynitride (SiON), dielectric material(s) with high dielectric constant (high-k), or a combination thereof. In some embodiments, the gate dielectric layer 134 is deposited by a plasma enhanced chemical vapor deposition (PECVD) process or by a spin coating process. The high dielectric constant (high-k) material may be hafnium oxide ($HfO_2$), zirconium oxide ($ZrO_2$), lanthanum oxide ($La_2O_3$), yttrium oxide ($Y_2O_3$), aluminum oxide ($Al_2O_3$), titanium oxide ($TiO_2$) or another applicable material.

The gate electrode layer 138 is made of conductive material, such as aluminum (Al), copper (Cu), tungsten (W), titanium (Ti), tantalum (Ta), or other applicable materials. In some embodiments, the gate electrode layer 138 includes a work function layer. The work function layer is made of metal material, and the metal material may include N-work-function metal or P-work-function metal. The N-work-function metal includes tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr) or a combination thereof. The P-work-function metal includes titanium nitride (TiN), tungsten nitride (WN), tantalum nitride (TaN), ruthenium (Ru) or a combination thereof.

The gate electrode layer 138 is formed by a deposition process, such as chemical vapor deposition (CVD), physical vapor deposition (PVD), atomic layer deposition (ALD), high density plasma CVD (HDPCVD), metal organic CVD (MOCVD), or plasma enhanced CVD (PECVD).

Figure 1H:
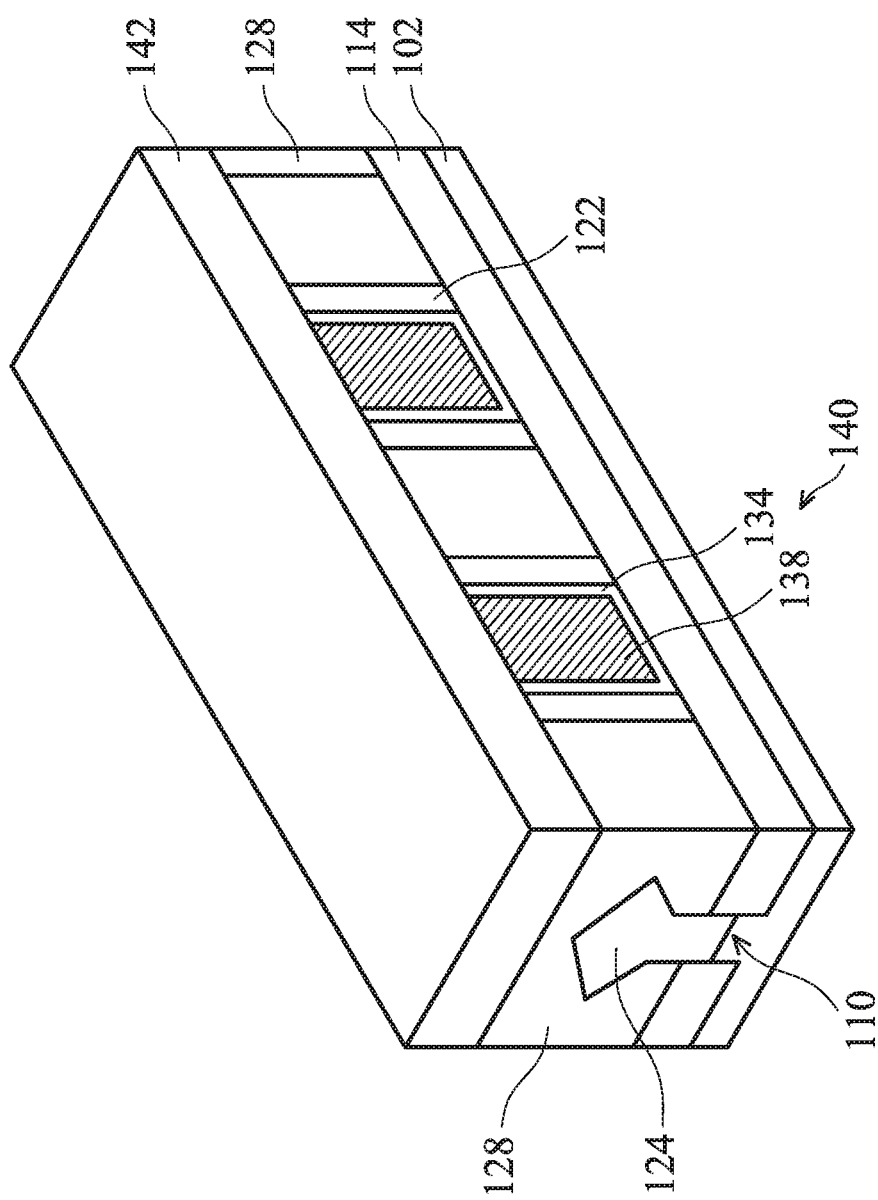
Figure 11:
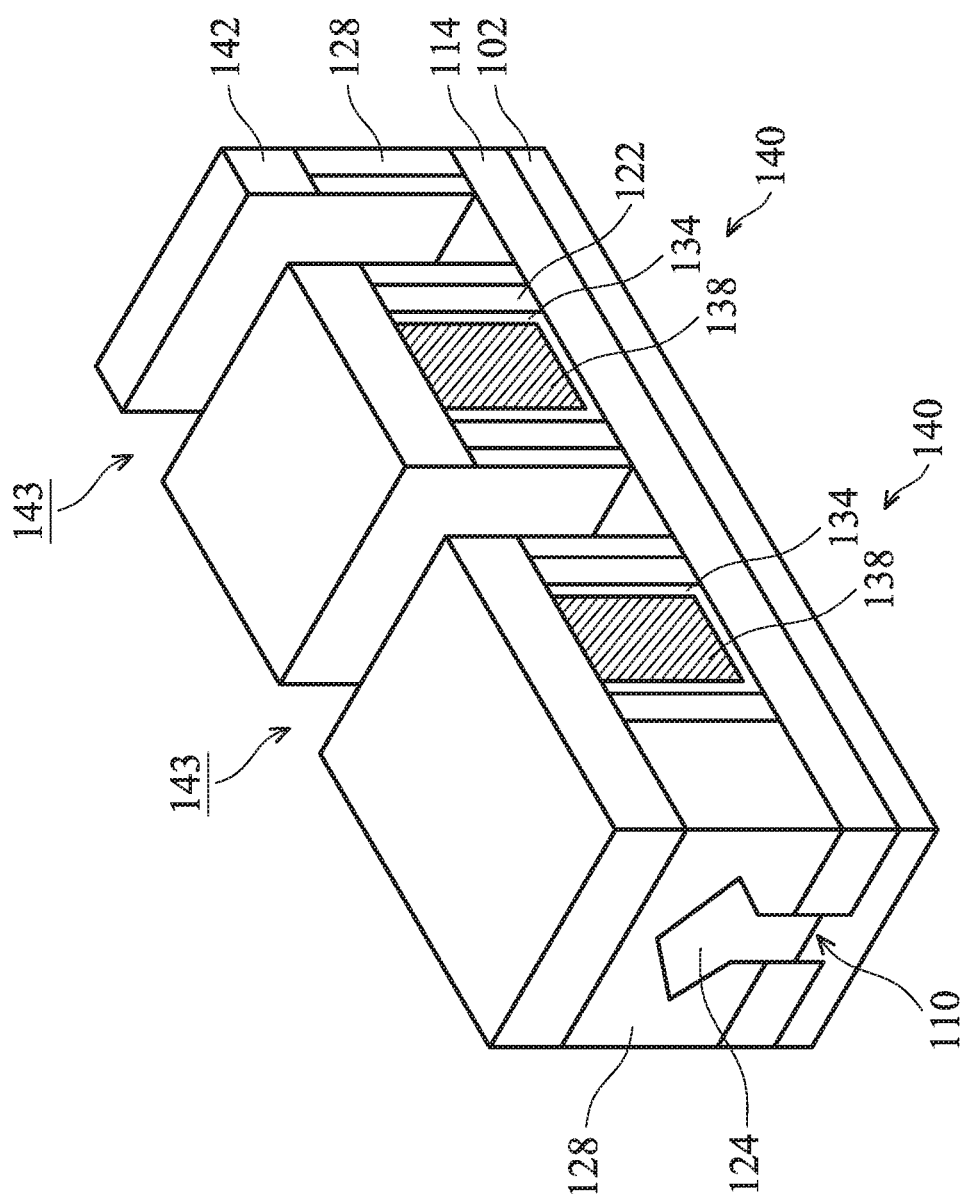

Next, as shown in FIG. 1H, a first dielectric layer 142 is formed over the gate structure 140 and over the ILD structure 128, in accordance with some embodiments.

The first dielectric layer 142 may be a single layer or multiple layers. The first dielectric layer 142 is made of silicon oxide (SiOx), silicon nitride (SixNy), silicon oxynitride (SiON), dielectric material(s) with low dielectric constant (low-k), or combinations thereof. In some embodiments, the first dielectric layer 142 is made of an extreme low-k (ELK) dielectric material with a dielectric constant (k) less than about 2.5. In some embodiments, ELK dielectric materials include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), porous SiLK, or porous silicon oxide ($SiO_2$). In some embodiments, the dielectric layer 142 is deposited by a plasma enhanced chemical vapor deposition (PECVD) process or by a spin coating process.

Afterwards, as shown in FIG. 1I, a portion of the first dielectric layer 142, a portion of the ILD structure 128 are removed to form a trench 143, in accordance with some embodiments. As a result, the S/D structure 124 is exposed by the trench 143.

Figure 1J:
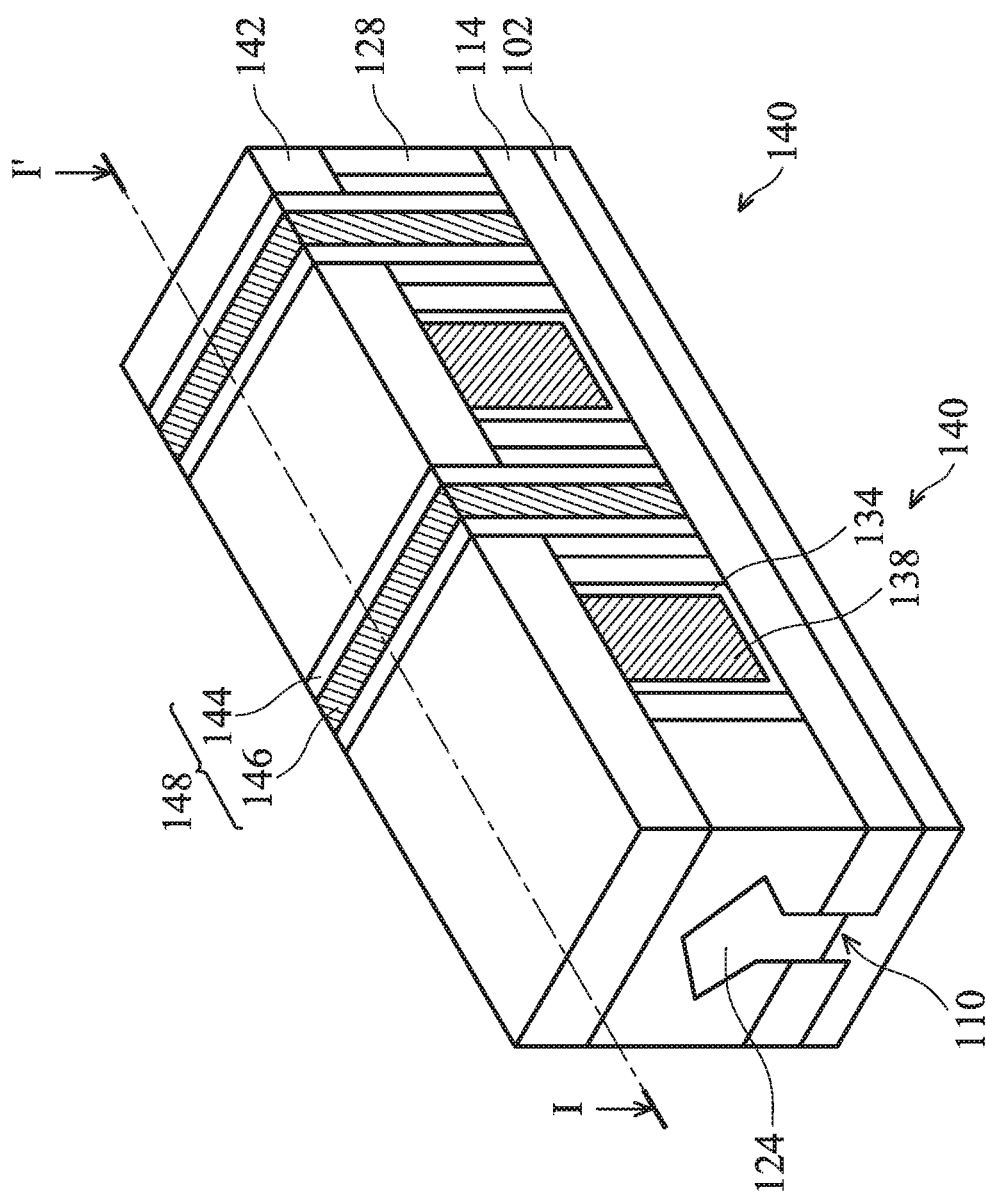

Subsequently, as shown in FIG. 1J, a glue layer 144 is formed in the sidewall surfaces of the trench 143, and a metal layer 146 is formed on the glue layer 144, in accordance with some embodiments. An S/D contact structure 148 is constructed by the glue layer 144 and the metal layer 146. The S/D contact structure 148 is electrically connected to the S/D structure 124. A top surface of the S/D contact structure 148 is higher than a top surface of the gate structure 140.

Figure 1K:
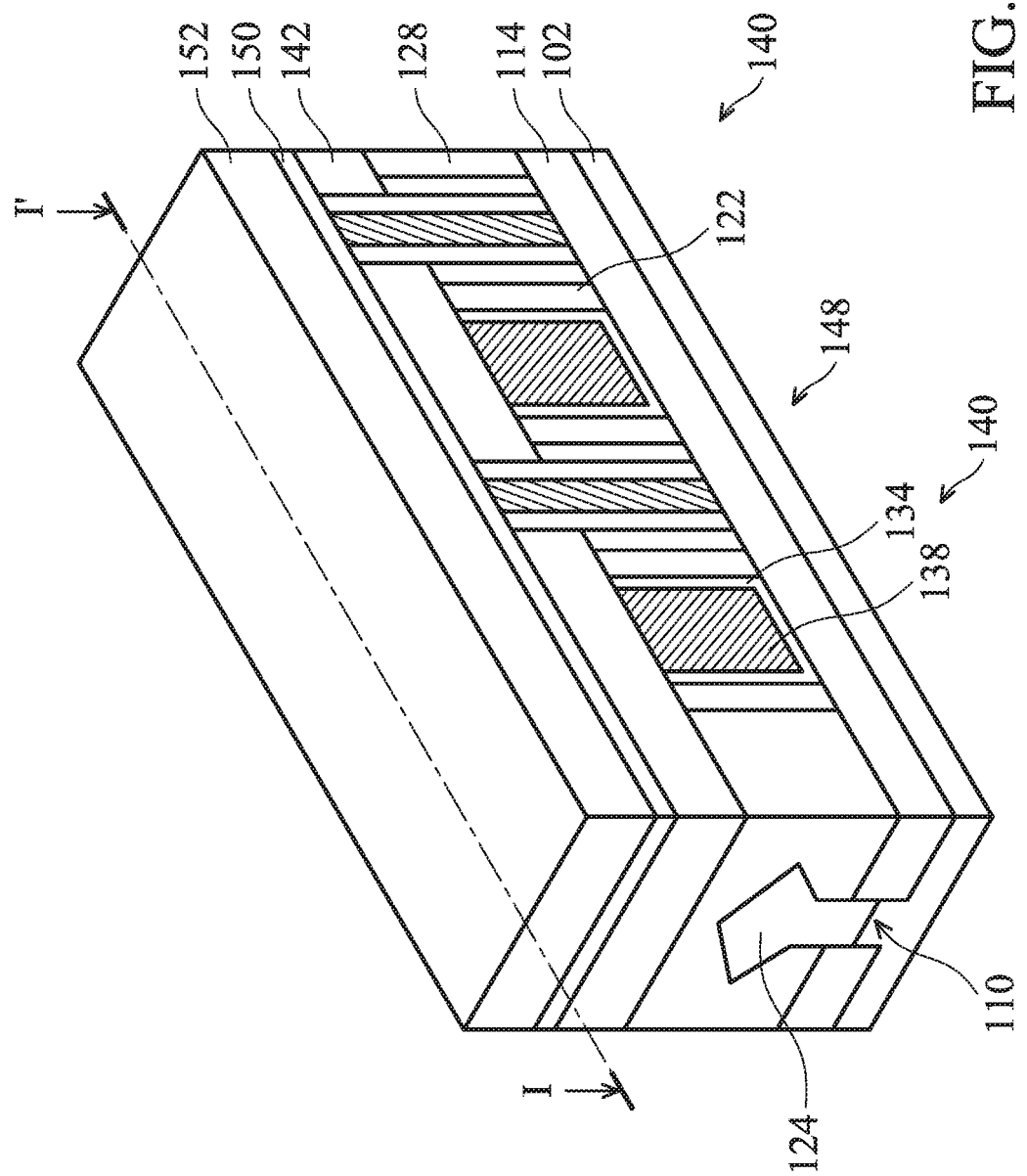

Afterwards, as shown in FIG. 1K, an etching stop layer 150 and a second dielectric layer 152 are formed on the first dielectric layer 142, in accordance with some embodiments.

Figure 1L:
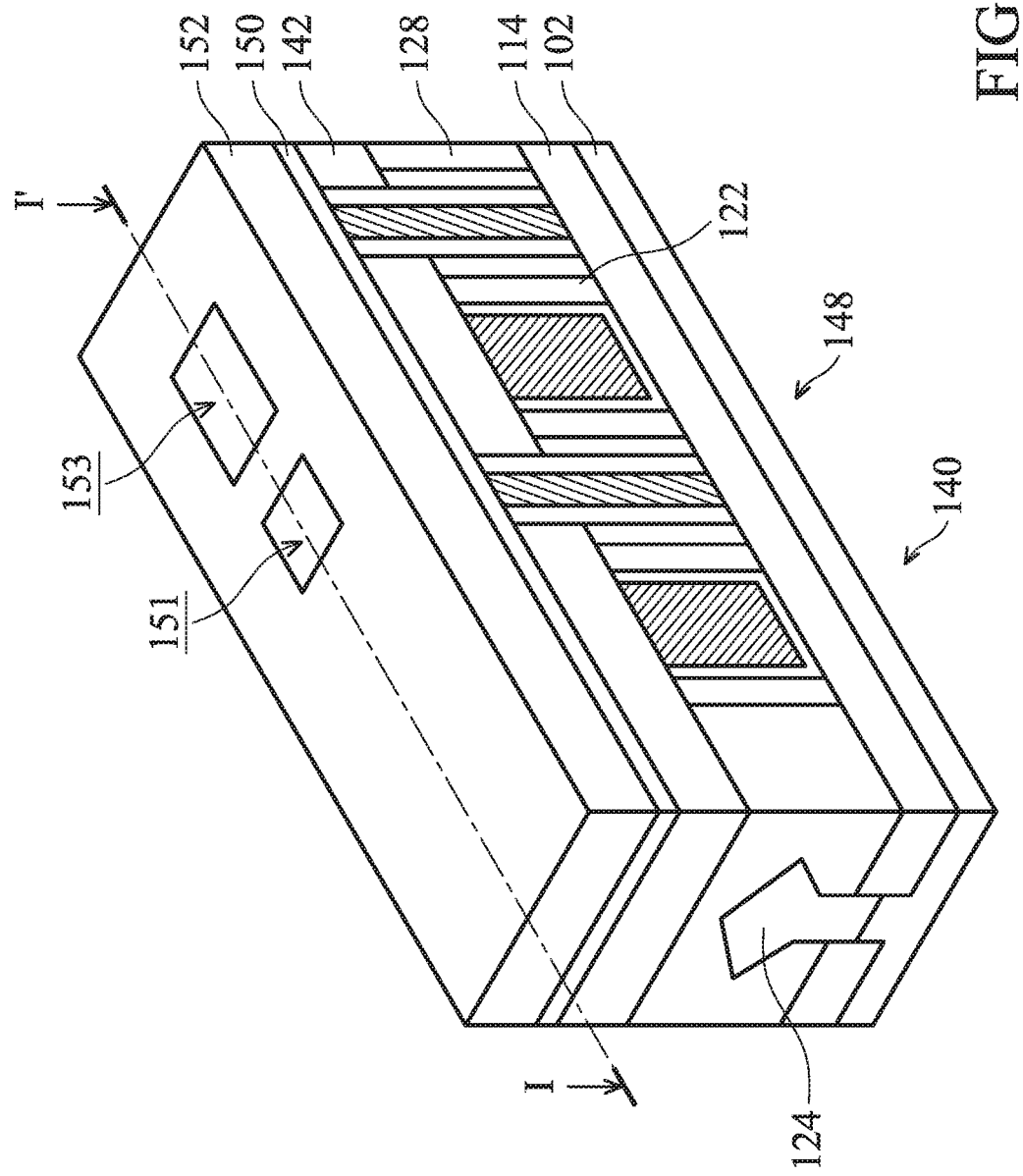

Next, as shown in FIG. 1L, a portion of the second dielectric layer 152 and a portion of the etching stop layer 150 are removed to form a first recess 151 above the S/D contact structure 148, in accordance with some embodiments. In addition, a portion of the second dielectric layer 152, a portion of the etching stop layer 150 and a portion of the first dielectric layer 142 are removed to form a second recess 153 above the gate structure 140.

Figure 2A:
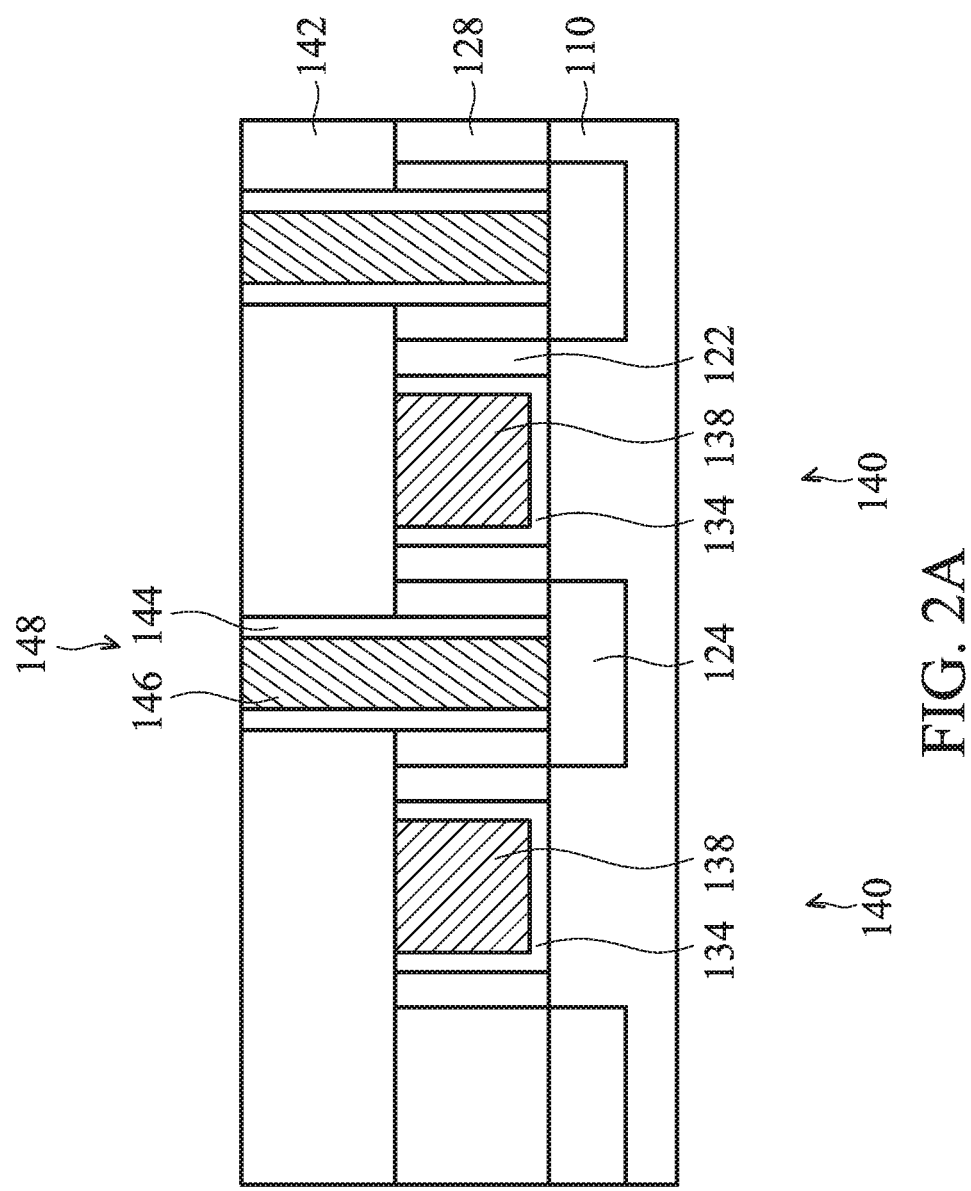
FIGS. 2A-2G show cross-sectional representations of various stages of forming a FinFET device structure after the FinFET device structure after FIG. 1J, in accordance with some embodiments of the disclosure.

FIGS. 2A-2G show cross-sectional representations of various stages of forming a FinFET device structure 100a after the FinFET device structure of FIG. 1I, in accordance with some embodiments of the disclosure. FIG. 2A is a cross-sectional representation taken along the II' line of FIG. 1J.

As shown in FIG. 2A, the glue layer 144 is formed in the sidewall surfaces of the trench 143, and the metal layer 146 is formed on the glue layer 144, in accordance with some embodiments. The S/D contact structure 148 is constructed by the glue layer 144 and the metal layer 146. The S/D contact structure 148 is electrically connected to the S/D structure 124.

Figure 2B:
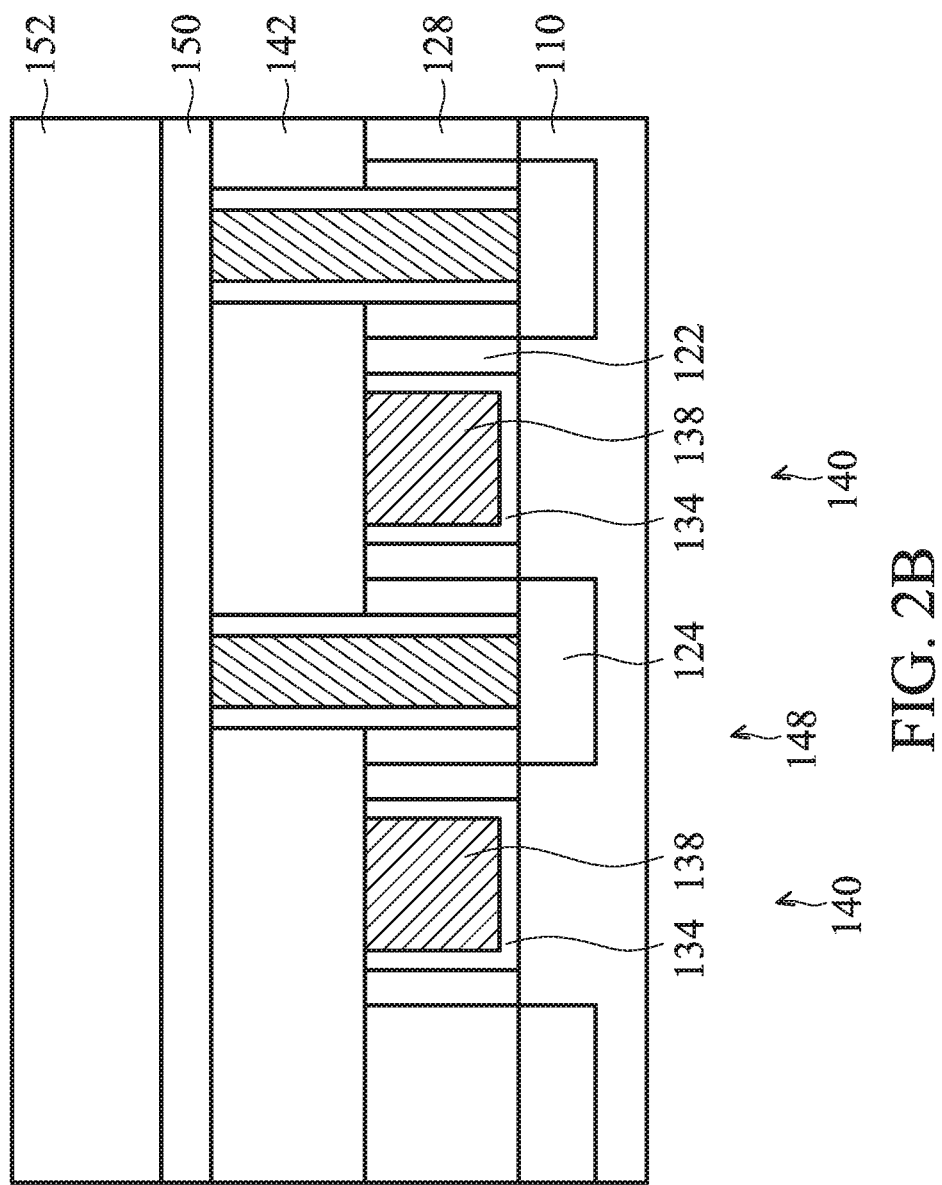

Next, as shown in FIG. 2B, the etching stop layer 150 and the second dielectric layer 152 are formed on the first dielectric layer 142, in accordance with some embodiments.

Figure 2C:
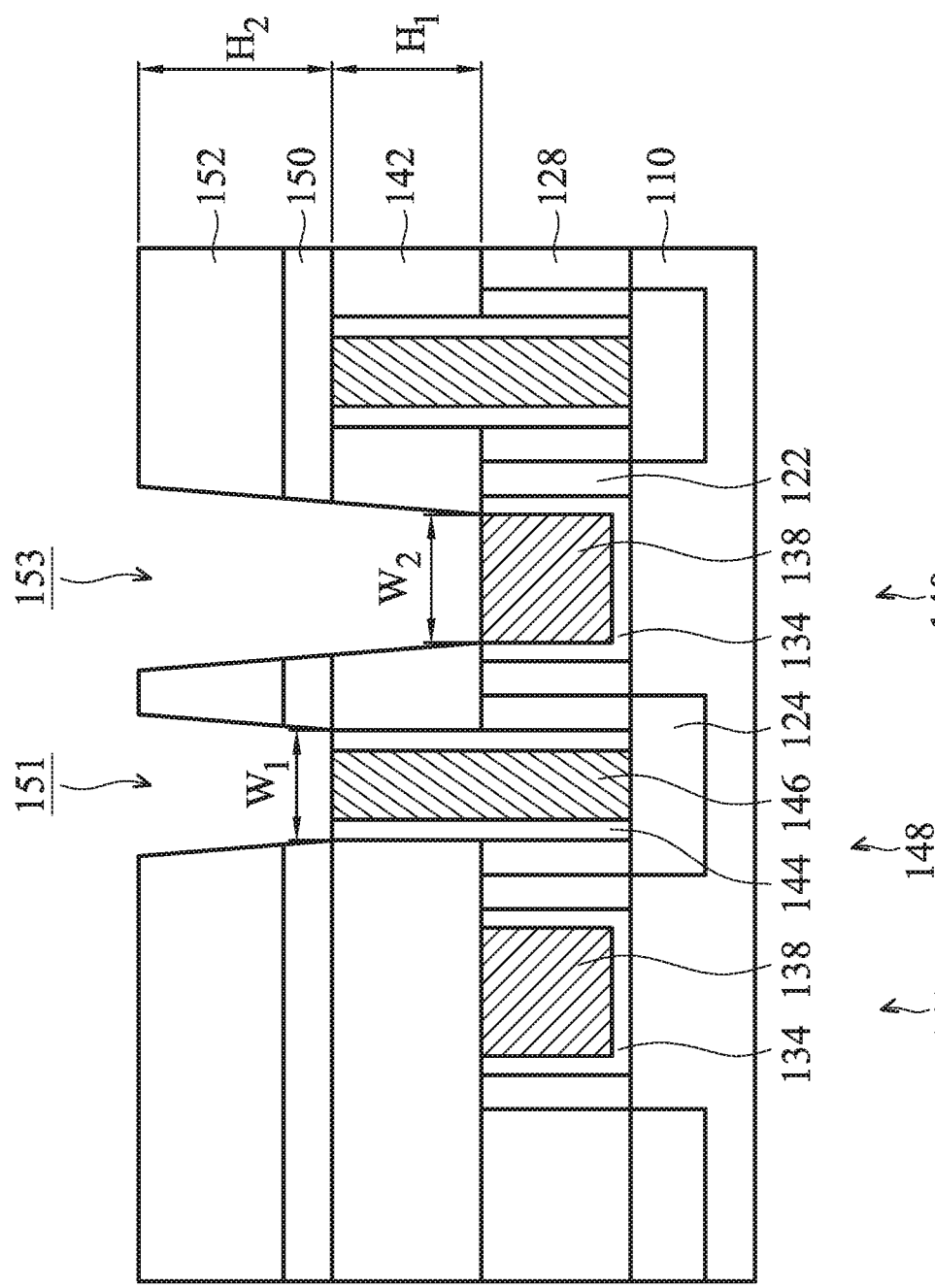

Subsequently, as shown in FIG. 2C, the first recess 151 and the second recess 153 are formed over the S/D contact structure 148 and the gate structure 140, respectively, in accordance with some embodiments.

The top surface of the S/D contact structure 148 is exposed by the first recess 151, and the top surface of the gate structure 140 is exposed by the second recess 153. In some embodiments, the top surface of the gate electrode layer 138 is exposed, but the top surface of the gate dielectric layer 134 is not exposed. In some embodiments, the top surface of the metal layer 146 and the top surface of the glue layer 144 are exposed.

It should be noted that the first recess 151 and the second recess 153 are simultaneously formed in an etching process. The etching process may include multiple etching operations.

Figure 4:
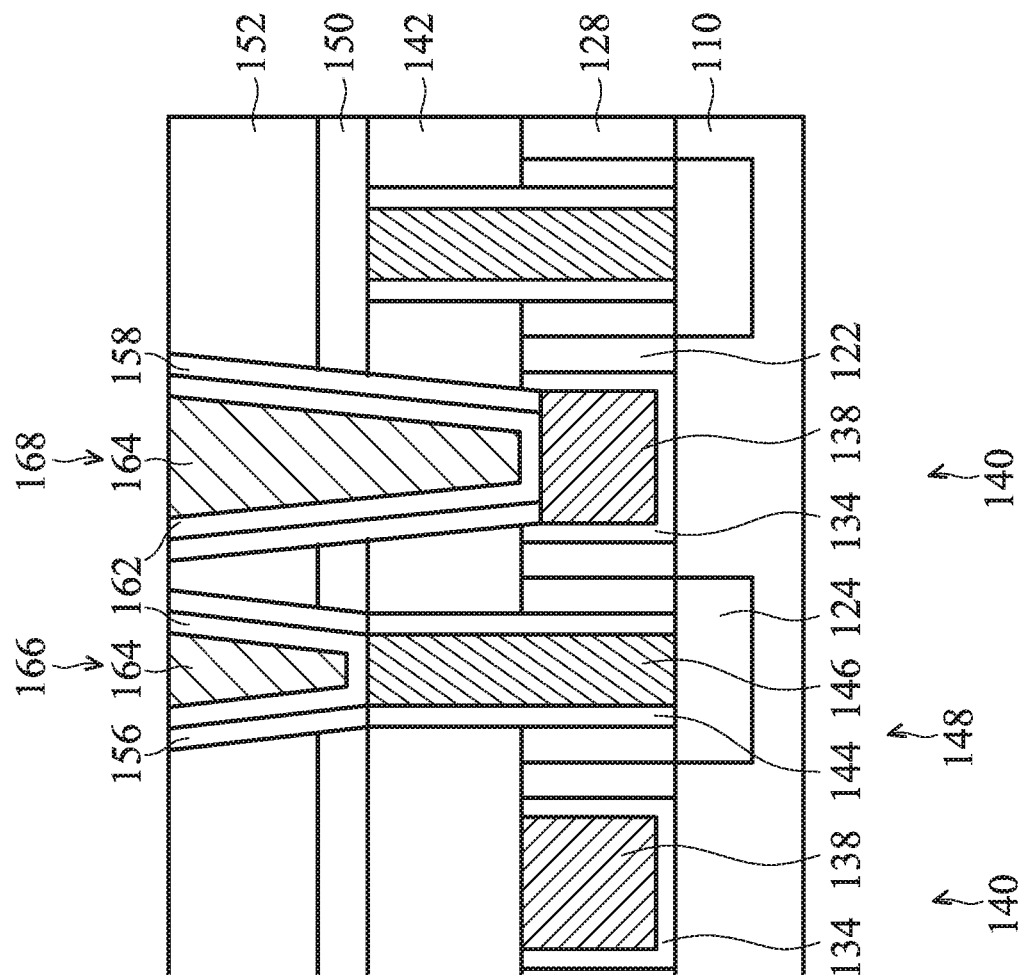
FIG. 4 shows a cross-sectional representation of a modified FinFET device structure, in accordance with some embodiments of the disclosure.

In some other embodiments, as shown in FIG. 4, a top portion of the gate electrode layer 138 is slightly etched, and therefore a top surface of the gate electrode layer 138 is lower than the top surface of the gate dielectric layer 134.

In some embodiments, the first dielectric layer 142 has a first height $H_1$, the sum of the height of the etching stop layer 150 and the height of the second dielectric layer 152 is the second height $H_2$. In some embodiments, the first height $H_1$ is in a range from about 10 nm to about 15 nm. In some embodiments, the second height $H_2$ is in a range from about 30 nm to about 60 nm.

In some embodiments, the first recess 151 has a tapered width from top to bottom. In some embodiments, the first recess 151 has a first bottom width $W_1$. In some embodiments, the second recess 153 has a tapered width from top to bottom. In some embodiments, the second recess 153 has a second bottom width $W_2$. The first bottom width $W_1$ of the first recess 151 is smaller than the second bottom width $W_2$ of the second recess 153. In some embodiments, the first bottom width $W_1$ is in a range from about 14 nm to about 24 nm. In some other embodiments, the second bottom width $W_2$ is in a range from about 12 nm to about 22 nm.

As shown in FIG. 2C, the aspect ratio (a ratio of the depth to the width) of the first recess 151 is in a range from about 0.4 to about 1.2. The aspect ratio of the second recess 153 is in a range from about 1.5 to about 6.5. If the isolation material 154 (formed later) is too thick, the other filling materials are difficult to fill into the second recess 153 with high aspect ratio. Therefore, the isolation material 154 (formed later) should be thin and does not occupy too much area of the second recess 153.

Figure 2D:
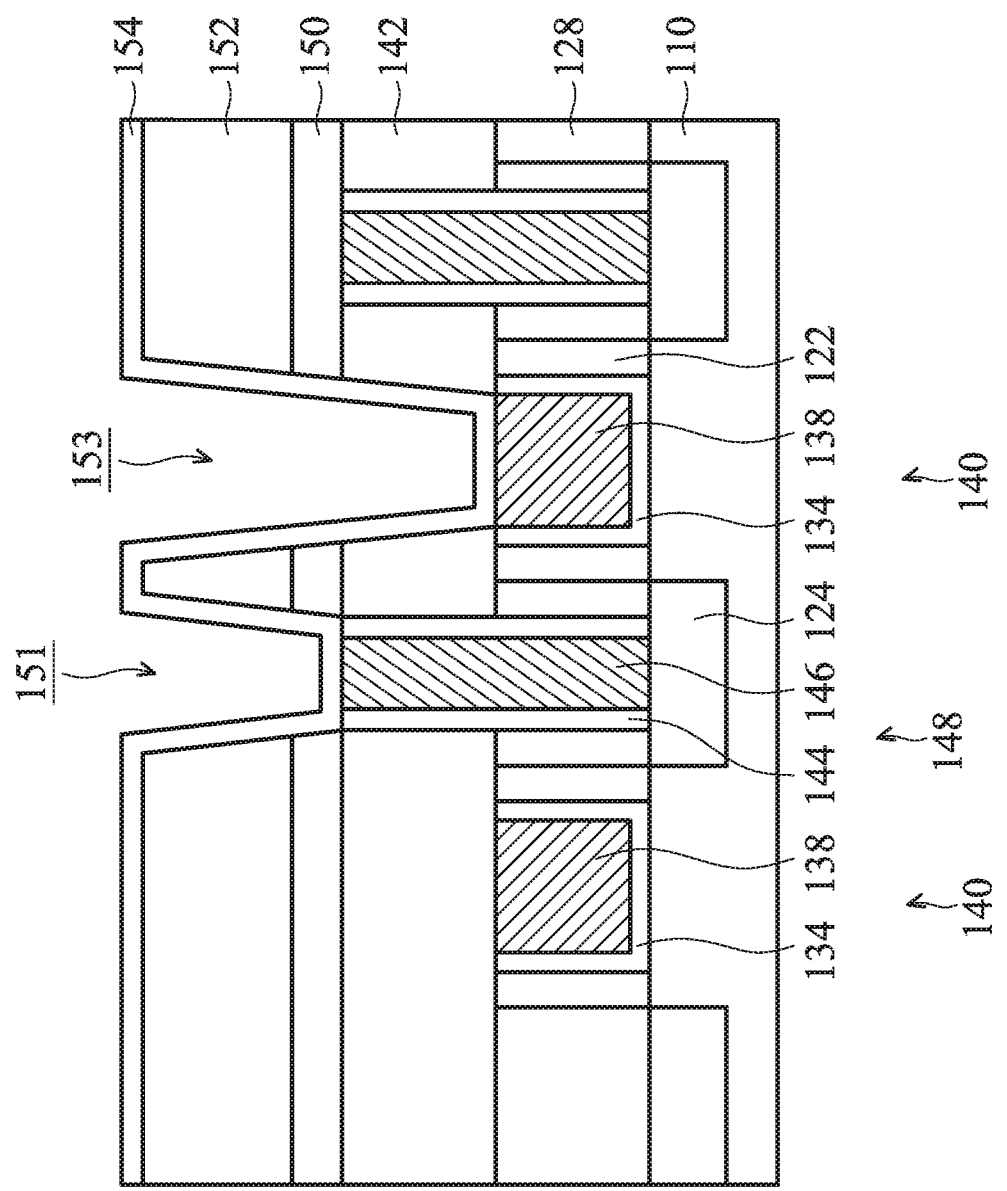

Next, as shown in FIG. 2D, an isolation material 154 is formed on sidewalls and the bottom surface of the first recess 151 and that of the second recess 153, in accordance with some embodiments.

The isolation material 154 is made of high-k material. The term "high-k" refers to a high dielectric constant. In the field of semiconductor device structures and manufacturing processes, high-k refers to a dielectric constant that is greater than the dielectric constant of $SiO_2$ (i.e., greater than 3.9). In some embodiments, the dielectric constant (k value) of the isolation material 154 is in a range from about 4 to about 11. The high-k material of the isolation material is configured to improve the isolation effect. In some embodiments, the high-k material includes silicon nitride (SiN), silicon carbon nitride (SiCN), silicon oxynitride, hafnium oxide, zirconium oxide, aluminum oxide, or another applicable material.

In some embodiments, the isolation material 154 is formed by a deposition process, such as chemical vapor deposition (CVD) process, physical vapor deposition (PVD) process, atomic layer deposition (ALD) process, plating process or another application process. In some embodiments, when the isolation material 154 is formed by the atomic layer deposition (ALD) process, the precursor material includes dichlorosilane (DCS). In some embodiments, the ALD process is performed at a temperature in a range from about 200 degrees to about 550 degrees.

In order to avoid that the material of the metal layer 146 of the S/D contact structure 148 is degraded, the temperature of the ALD process is well-controlled. In some embodiments, when the metal layer 146 of the S/D contact structure 148 is made of tungsten (W), the ALD process is performed at a temperature in a range from about 200 degrees to about 550 degrees. In some other embodiments, when the metal layer 146 of the S/D contact structure 148 is made of cobalt (Co), the ALD process is performed at a temperature in a range from about 200 degrees to about 350 degrees.

Figure 2E:
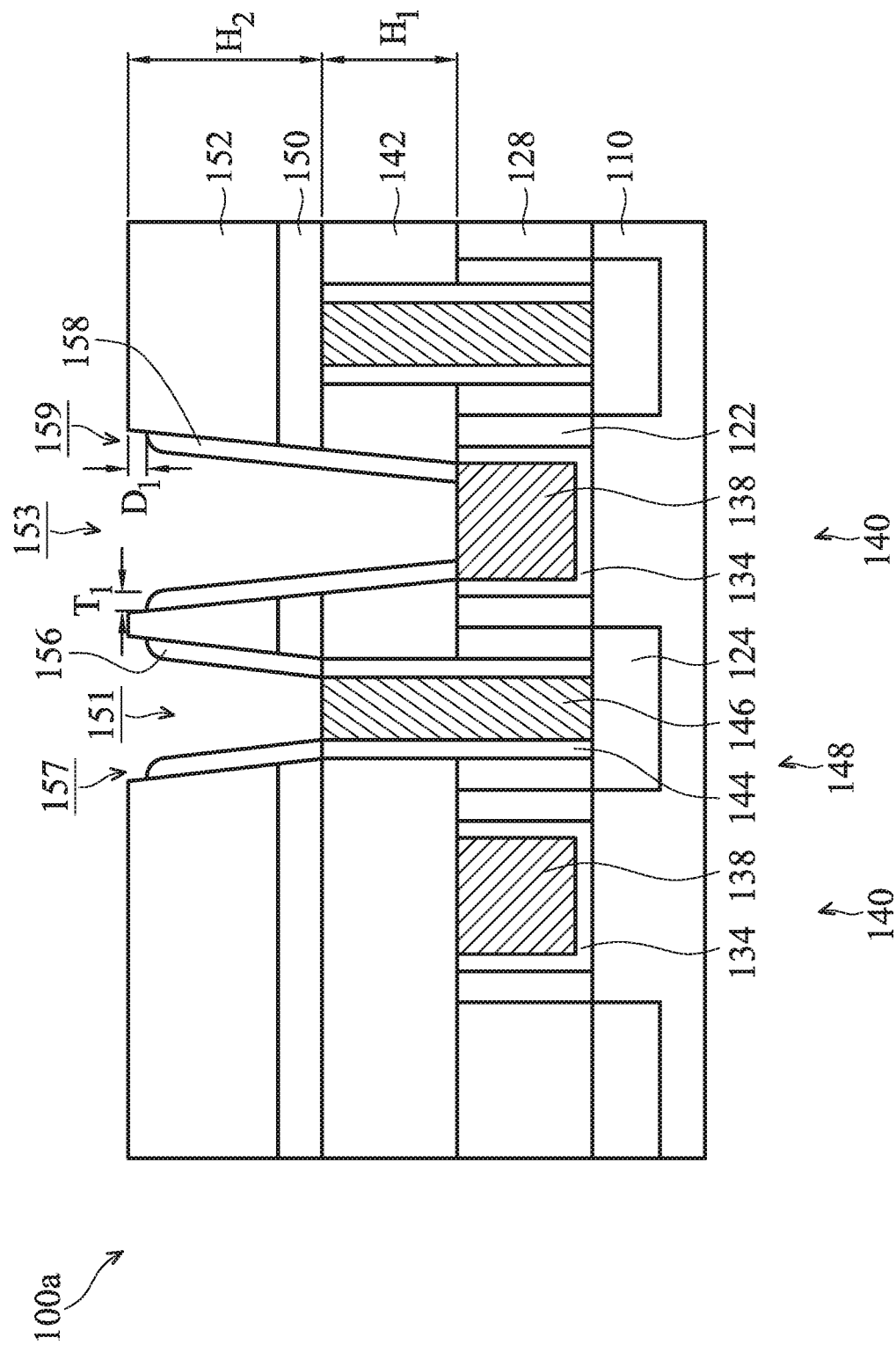

Afterwards, as shown in FIG. 2E, a portion of the isolation material 154 is removed to form a first isolation layer 156 over the S/D contact structure 148 and to form a second isolation layer 158 over the gate structure 140, in accordance with some embodiments.

More specifically, a first portion of the isolation material 154 which is directly formed on the second dielectric layer 152 is removed, and a second portion of the isolation material 154 which is directly formed on the gate electrode layer 138 and the metal layer 146 is removed. That is, the horizontal portion of the isolation material 154 is removed, but a portion of the vertical portion of the isolation material 154 is left. It should be noted that the portion of the vertical portion of the isolation material 154 is left on sidewall surfaces of the first recess 151 and that of the second recess 153. The top surface of the gate electrode layer 138 is not covered by the second isolation layer 158, and the top surface of the metal layer 146 is not covered by the first isolation layer 156.

It should be noted that since a portion of the vertical portion is removed by the etching process to form a first void 157 and a second void 159. The first void 157 is directly above the first isolation layer 156, and the second void 159 is directly above the second isolation layer 158.

In some embodiments, the portion of the isolation material 154 is removed by using a dry etching process and an ashing process. The etching process is configured to remove the extra isolation material 154, and the ashing process is configured to remove the by-products. In some embodiments, the etching selectivity of the isolation material 154 to the second dielectric layer 152 is in a range from about 4 to about 10.

In some embodiments, the etching gas used in the dry etching process includes fluorine-containing gas, such as carbon tetrafluoride ($CF_4$), perfluoroethane ($C_2F_6$), or chlorotrifluoromethane ($CF_3Cl$), and hydrogen ($H_2$) gas. In addition, the etching gas may include inert gas, such as argon (Ar), helium (He), carbon dioxide ($CO_2$), oxygen ($O_2$), nitrogen ($N_2$) or another applicable gas. In some embodiments, the dry etching process is performed at a temperature in a range from about 50 degrees to about 100 degrees. In some other embodiments, the dry etching process is performed at a pressure in a range from about 10 mtorr to about 100 mtorr. In some embodiments, the ashing gas used in the ashing process includes nitrogen ($N_2$) and hydrogen ($H_2$) gas.

It should be noted that the dielectric constant (k value) of the first isolation layer 156 or dielectric constant (k value) of the second isolation layer 158 is greater than that of the first dielectric layer 142. The dielectric constant (k value) of the first isolation layer 156 or dielectric constant (k value) of the second isolation layer 158 is smaller than that of the first gate dielectric layer 134.

As shown in FIG. 2E, the top surface of the etching stop layer 150 is higher than the bottom surface of the second isolation layer 158 and lower than the top surface of the first isolation layer 156. In some embodiments, the first dielectric layer 142 has a first height $H_1$, the sum of the height of the etching stop layer 150 and the height of the second dielectric layer 152 is the second height $H_2$. In some embodiments, the first height $H_1$ is in a range from about 10 nm to about 15 nm. In some embodiments, the second height $H_2$ is in a range from about 30 nm to about 60 nm. In some embodiments, each of the first void 157 and the second void 159 has a depth $D_1$ which measured from the top surface of the second dielectric layer 152 to the top surface of the first isolation layer 156 or the top surface of the second isolation layer 158. In some embodiments, the depth $D_1$ is in a range from about 3 nm to about 15 nm.

Each of the first isolation layer 156 and the second isolation layer 158 has a thickness $T_1$. In some embodiments, the thickness $T_1$ is in a range from about 1 nm to about 3 nm. If the thickness $T_1$ is too small, the isolation effect may not good enough. If the thickness $T_1$ is too great, the distance between the S/D conductive plug 166 and the gate contact structure 168 cannot be narrowed.

Figure 2F:
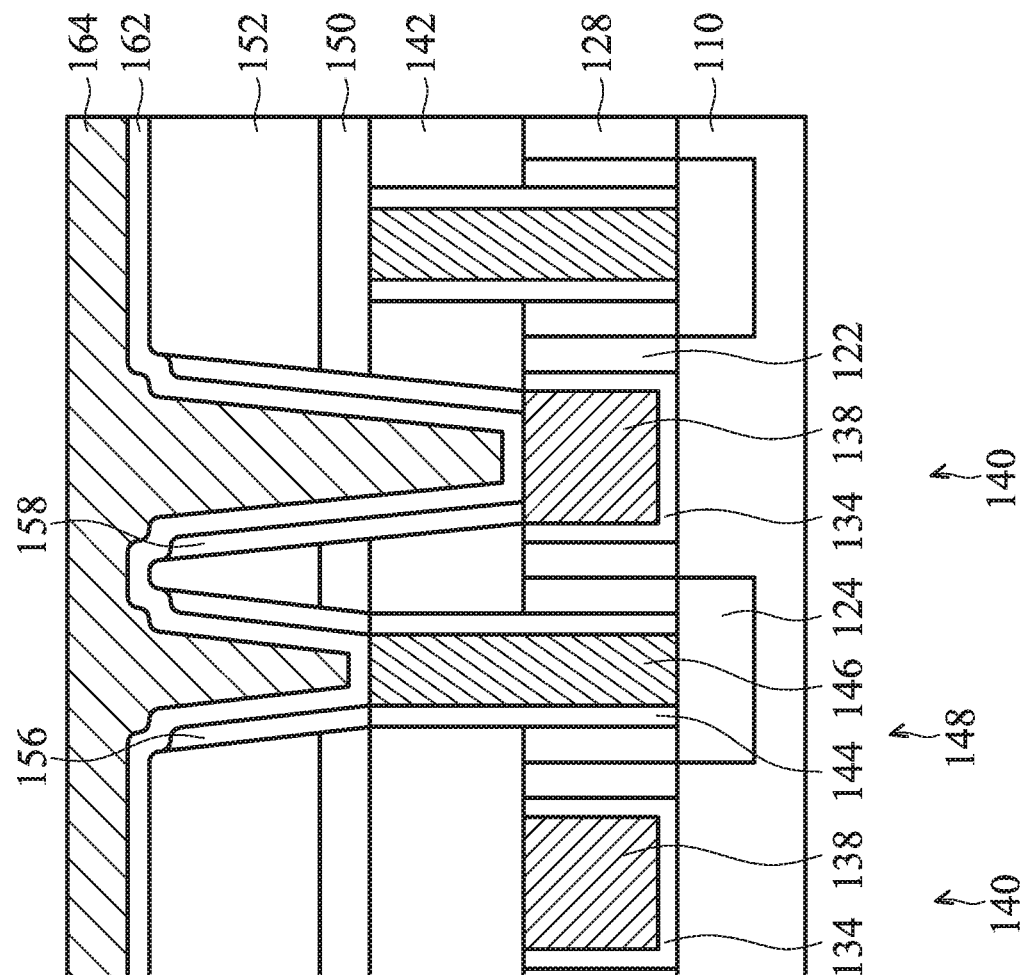

Next, as shown in FIG. 2F, a barrier layer 162 is formed in the first recess 151, the first void 157, the second recess 153, and the second void 159, in accordance with some embodiments. Afterwards, a second conductive layer 164 is formed over the barrier layer 162. In other words, the first recess 151 and the first void 157 are filled with the barrier layer 162 and the second conductive layer 164, and the second recess 153 and the second void 159 are filled with the barrier layer 162 and the second conductive layer 164.

In some embodiments, the barrier layer 162 is made of tantalum (Ta), tantalum nitride (TaN), titanium (Ti), titanium nitride (TiN), cobalt tungsten (CoW) or another applicable material. In some embodiments, the barrier layer 162 is formed by a deposition process, such as a chemical vapor deposition (CVD) process, physical vapor deposition (PVD) process, atomic layer deposition (ALD) process, plating process or another application process.

In some embodiments, the second conductive layer 164 is made of tungsten (W), cobalt (Co), titanium (Ti), aluminum (Al), copper (Cu), tantalum (Ta), platinum (Pt), molybdenum (Mo), silver (Ag), manganese (Mn), zirconium (Zr), ruthenium (Ru), or another application material. In some embodiments, the second conductive layer 164 is formed by a deposition process, such as a chemical vapor deposition (CVD) process, physical vapor deposition (PVD) process, atomic layer deposition (ALD) process, plating process or another application process.

Figure 2G:
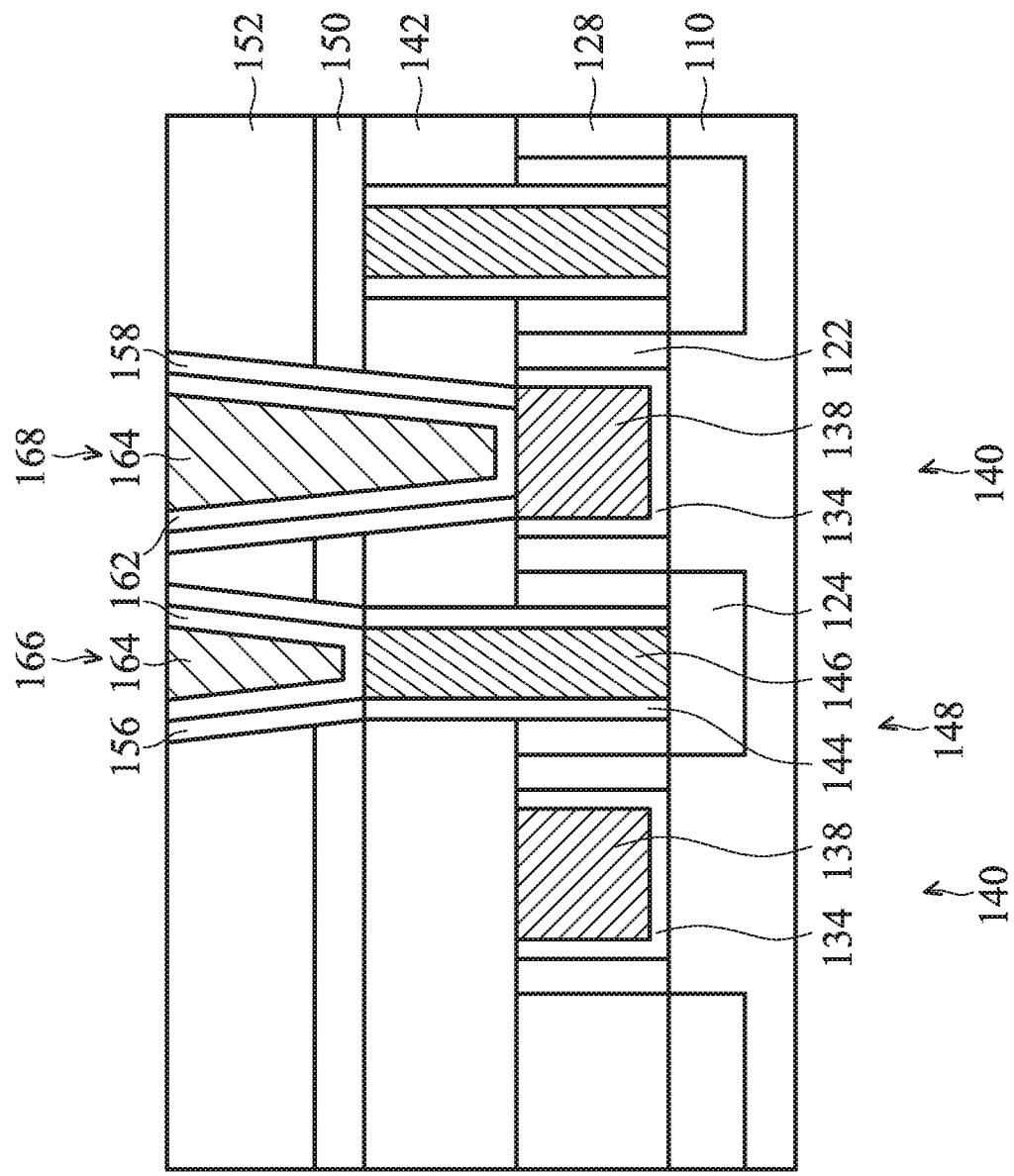

Afterwards, as shown in FIG. 2G, a polishing process is performed on the barrier layer 162 and the second conductive layer 164 to form an S/D conductive plug 166 and a gate contact structure 168, in accordance with some embodiments. The S/D conductive plug 166 is constructed by the barrier layer 162 and the second conductive layer 164, and the gate contact structure 168 is constructed by the barrier layer 162 and the second conductive layer 164. Since the S/D conductive plug 166 and the gate contact structure 168 are formed simultaneously, the S/D conductive plug 166 and the gate contact structure 168 both have the same construction.

The S/D conductive plug 166 is formed on the S/D contact structure 148 and is electrically connected to the S/D contact structure 148. The gate contact structure 168 is formed on the gate structure 140 and is electrically connected to the gate structure 140. In some embodiments, the barrier layer 162 has a U-shaped structure. In the S/D conductive plug 166, the barrier layer 162 is between the first isolation layer 156 and the second conductive layer 164. In the gate contact structure 168, the barrier layer 162 is between the second isolation layer 158 and the second conductive layer 164. It should be noted that the S/D conductive plug 166 is surrounded by the first isolation layer 156, and the gate contact structure 168 is surrounded by the second isolation layer 158. The bottom surface of the first isolation layer 156 is higher than the bottom surface of the second isolation layer 158.

It should be noted that the dielectric constant of the first isolation layer 156 (or the second isolation layer 158) is greater than that of the first dielectric layer 142. The dielectric constant of the first isolation layer 156 (or the second isolation layer 158) is greater than that of the second dielectric layer 152. The dielectric constant of the first isolation layer 156 (or the second isolation layer 158) is smaller than that of the first gate dielectric layer 134. In some embodiments, the dielectric constant of the isolation material 154 is in a range from about 4 to about 11. The dielectric constant of the first dielectric layer 142 is in a range from about 3.5 to about 3.9. The dielectric constant of the first gate dielectric layer 134 is in a range from about 12 to about 30.

The first isolation layer 156 surrounding the S/D conductive plug 166 is configured to improve the insulation effect of the S/D conductive plug 166. The second isolation layer 158 surrounding the gate contact structure 168 is configured to improve the insulation effect of the gate contact structure 168. As the size of the FinFET device structure 100a is gradually decreased, the distance between the S/D conductive plug 166 and the gate contact structure 168 is gradually decreased. If the S/D conductive plug 166 is too close to the gate contact structure 168, the current leakage may occur to degrade the performance of the FinFET device structure 100a. In order to prevent the current leakage, the S/D conductive plug 166 is separately from the gate contact structure 168 by the first isolation layer 156 and the second isolation layer 158.

Figure 2H:
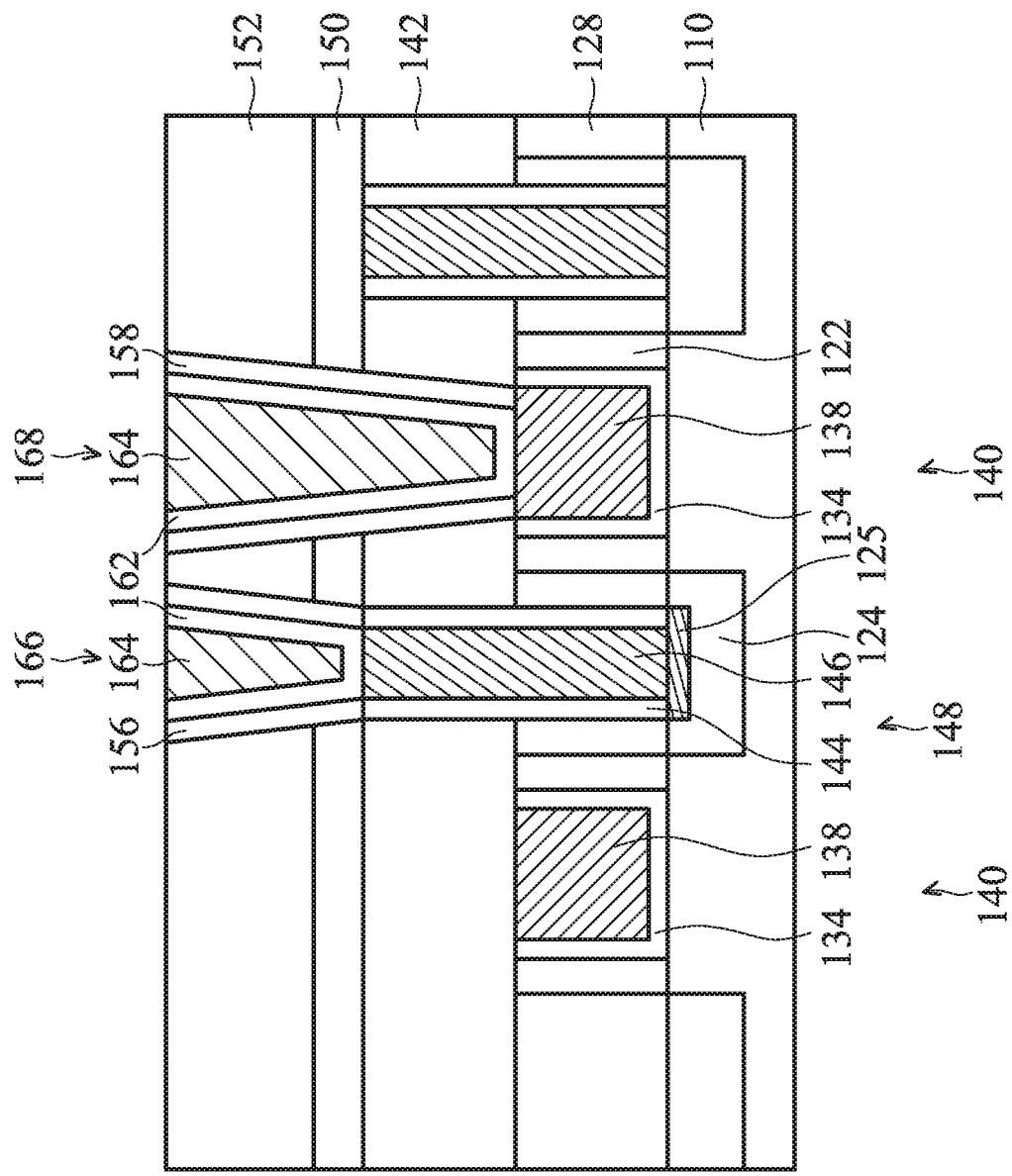
FIG. 2H shows a cross-sectional representation of a modified FinFET device structure, in accordance with some embodiments of the disclosure.

FIG. 2H shows a cross-sectional representation of a modified FinFET device structure 100b, in accordance with some embodiments of the disclosure. The FinFET device structure 100b of FIG. 2H is similar to the FinFET device structure 100a of FIG. 2G, the difference between FIG. 2H and FIG. 2G is a metal silicide layer 125 is between the S/D structures 124 and the S/D contact structure 148 in FIG. 2H'. The metal silicide layer 125 is used to reduce the contact resistance between the S/D structures 124 and the S/D contact structure 148. The S/D contact structure 148 is electrically connected to the S/D structures 124 by the metal silicide layer 125.

Figure 3:
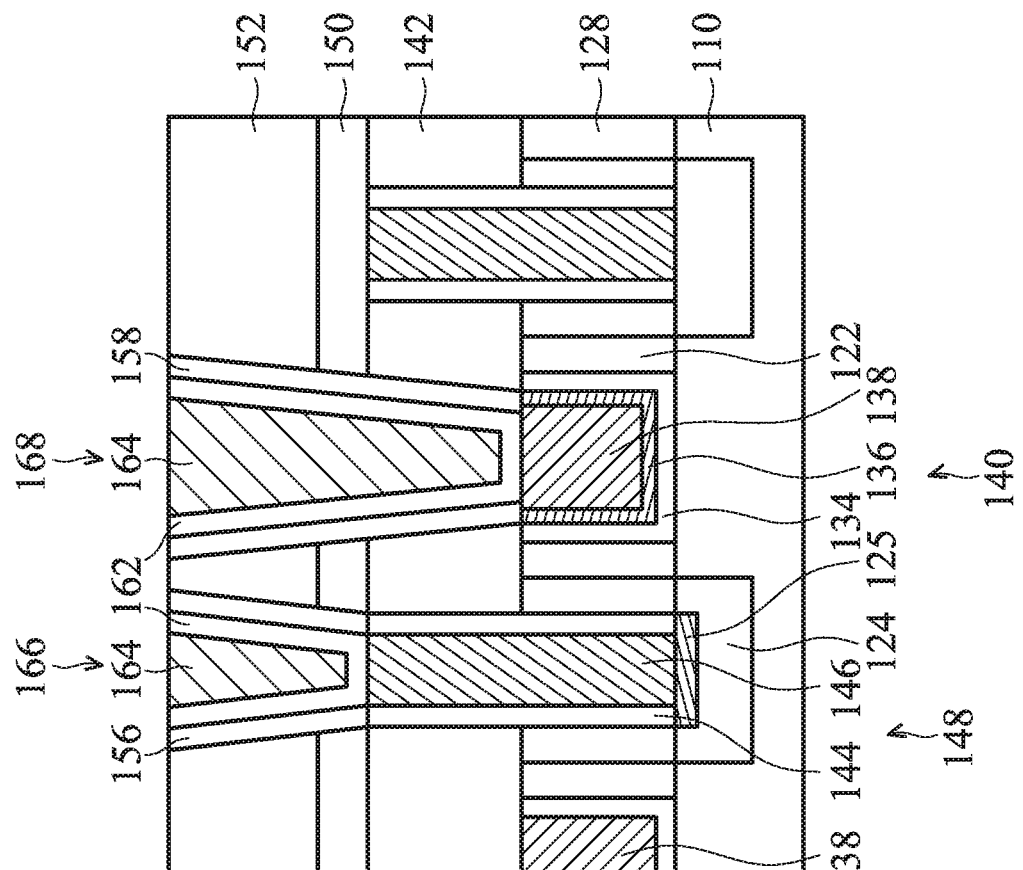
FIG. 3 shows a cross-sectional representation of a modified FinFET device structure, in accordance with some embodiments of the disclosure.

FIG. 3 shows a cross-sectional representation of a modified FinFET device structure 100c, in accordance with some embodiments of the disclosure. The FinFET device structure 100c of FIG. 3 is similar to the FinFET device structure 100a of FIG. 2G, the difference between FIG. 3 and FIG. 2G is that a work function layer 136 is between the gate dielectric layer 134 and the gate electrode layer 138 in FIG. 3.

The work function layer 136 is made of work function material. The work function material may include N-work-function metal or P-work-function metal. The N-work-function metal includes tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr) or a combination thereof. The P-work-function metal includes titanium nitride (TiN), tungsten nitride (WN), tantalum nitride (TaN), ruthenium (Ru) or a combination thereof.

FIG. 4 shows a cross-sectional representation of a modified FinFET device structure 100d, in accordance with some embodiments of the disclosure. The FinFET device structure 100d of FIG. 4 is similar to the FinFET device structure 100a of FIG. 2G, the difference between FIG. 4 and FIG. 2G is that the top surface of the gate electrode layer 138 is lower than the top surface of the gate spacer layers 122 and the top surface of the ILD structure 128 as shown in FIG. 4.

As shown in FIG. 4, a portion of the gate contact structure 168 is below the top surface of the first dielectric layer 142. More specifically, the bottom surface of the second isolation layer 158 is lower than the top surface of the gate dielectric layer 134. The bottom surface of the gate contact structure 168 is lower than the top surface of the gate dielectric layer 134 and the top surface of the ILD structure 128. More specifically, the bottom surface of the barrier layer 162 is lower than the top surface of the gate dielectric layer 134 and the top surface of the ILD structure 128.

Figure 5:
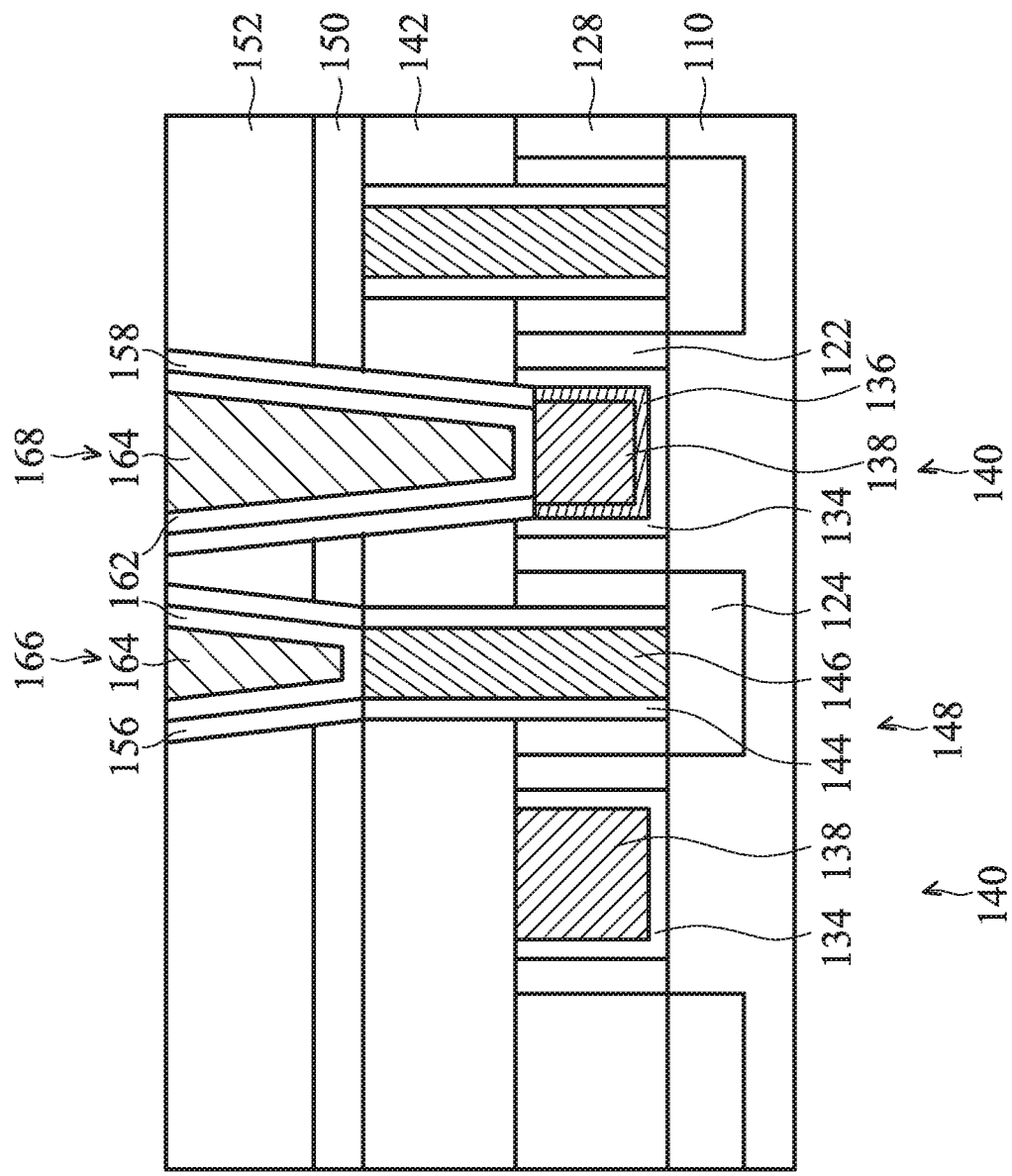
FIG. 5 shows a cross-sectional representation of a modified FinFET device structure, in accordance with some embodiments of the disclosure.

FIG. 5 shows a cross-sectional representation of a modified FinFET device structure 100e, in accordance with some embodiments of the disclosure. The FinFET device structure 100e of FIG. 5 is similar to the FinFET device structure 100c of FIG. 4, the difference between FIG. 5 and FIG. 4 is that the work function layer 136 is between the gate dielectric layer 134 and the gate electrode layer 138 as shown in FIG. 5. In some embodiments, the second isolation layer 158 is directly formed on the work function layer 136.

Figure 6:
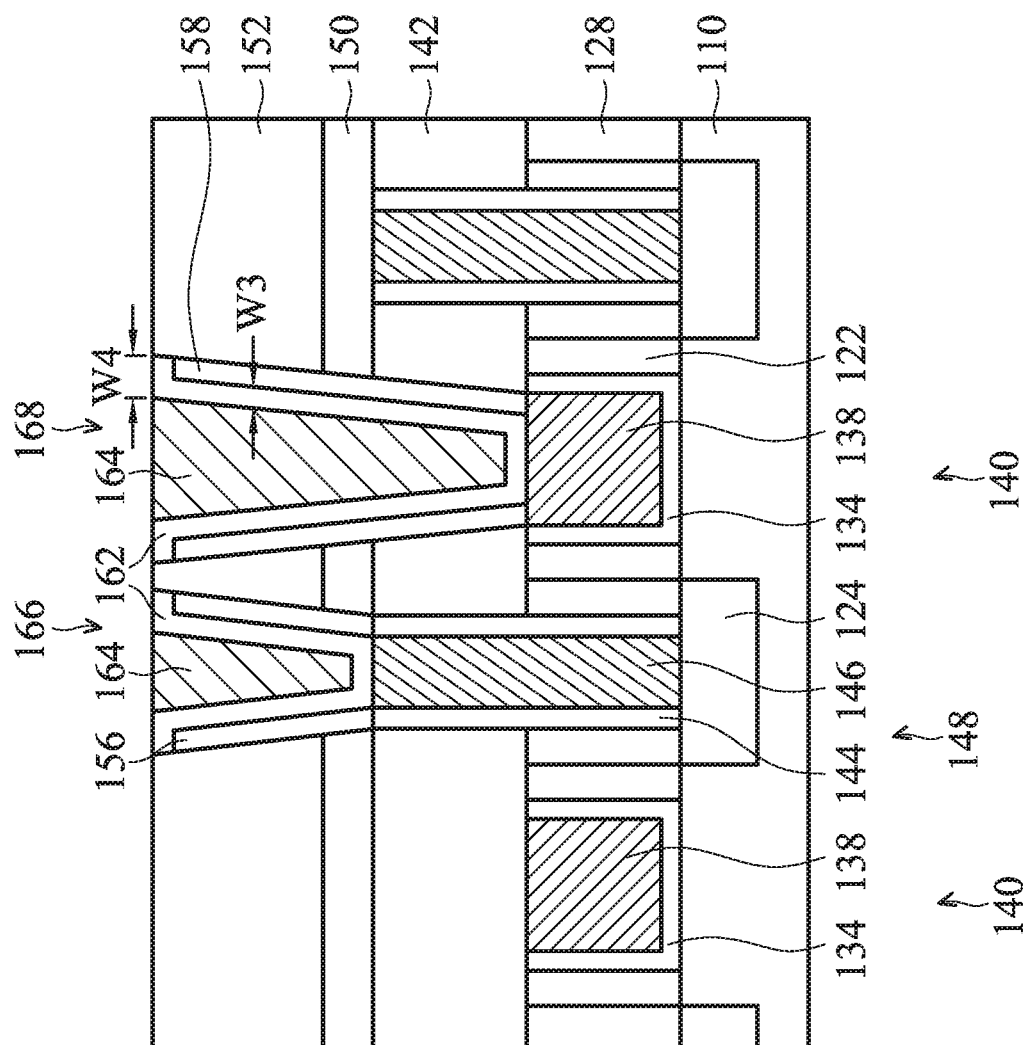
FIG. 6 shows a cross-sectional representation of a modified FinFET device structure, in accordance with some embodiments of the disclosure.

FIG. 6 shows a cross-sectional representation of a modified FinFET device structure 100f, in accordance with some embodiments of the disclosure. The FinFET device structure 100f of FIG. 6 is similar to the FinFET device structure 100a of FIG. 2G, the difference between FIG. 6 and FIG. 2G is that the top surface of the first isolation layer 156 and the top surface of the second isolation layer 158 are not exposed in FIG. 6.

As shown in FIG. 6, the first isolation layer 156 and the second isolation layer 158 are below the barrier layer 162. More specifically, the first void 157 (shown in FIG. 2E) directly above the first isolation layer 156 and the second void 159 (shown in FIG. 2E) directly above the second isolation layer 158 are filled with the barrier layer 162. In other words, the barrier layer 162 is formed on sidewall surfaces and on the top surface of the first isolation layer 156 and that of the second isolation layer 158. The barrier layer 162 has a first portion and a second portion. The first portion of the barrier layer 162 is in direct contact with the sidewall surfaces of the first isolation layer 156 and the sidewall surfaces of the second isolation layer 158. The second portion of the barrier layer 162 is in direct contact with the top surface of the first isolation layer 156 and the top surface of the second isolation layer 158. The sidewall portion of the barrier layer 162 has a third width $W_3$, and the top surface of the barrier layer 162 has a fourth width $W_4$. In some embodiments, the fourth width $W_4$ is greater than the third width $W_3$.

Figure 7:
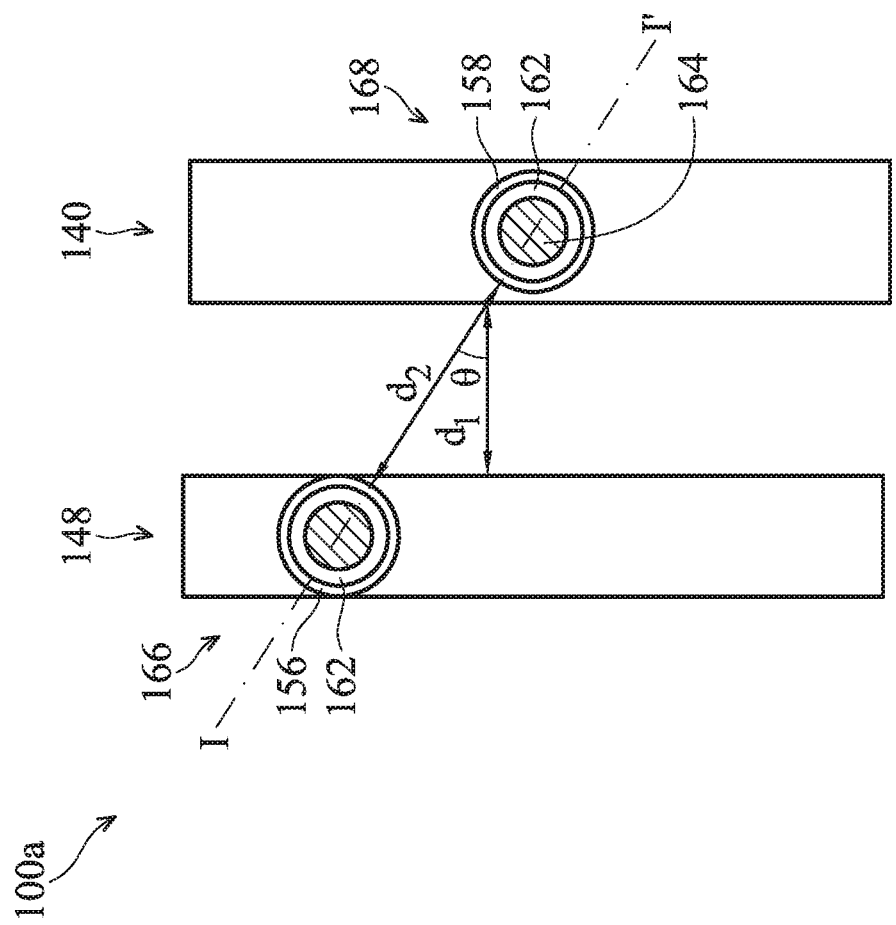
FIG. 7 shows a top-view of FinFET device structure, in accordance with some embodiments of the disclosure.

FIG. 7 shows a top-view of the FinFET device structure 100a, in accordance with some embodiments of the disclosure. FIG. 2G shows a cross-sectional view of the FinFET device structure 100a along II' line of FIG. 7, in accordance with some embodiments of the disclosure.

The gate contact structure 168 is formed over the gate structure 140, and the S/D contact structure 166 is formed over the S/D contact structure 148. The first isolation layer 156 has a ring-shaped structure when seen from a top-view. The second isolation layer 158 has a ring-shaped structure when seen from a top-view. The first isolation layer 156, the barrier layer 162 and the second conductive layer 164 form a concentric ring structure.

There is a first distance $d_1$ between the sidewall surface of the gate structure 140 and the sidewall surface of the S/D contact structure 148 in the horizontal direction (or a first direction). There is a second distance $d_2$ between the outer sidewall surface of the first isolation layer 156 and the outer sidewall surface of the second isolation layer 158 along a second direction. The second distance $d_2$ is on the II' line. An angle is between the first direction and the second direction. In some embodiments, the first distance $d_1$ is in a range from about 3 nm to about 7 nm. In some embodiments, the second distance $d_2$ is in a range from about 10 nm to about 14 nm. In some embodiments, the angle is in a range from about 30 degrees to about 60 degrees. Since the first isolation layer 156 and the second isolation layer 158 is between the gate structure 140 and the S/D contact structure 148, the current leakage problem can be prevented.

Figure 8:
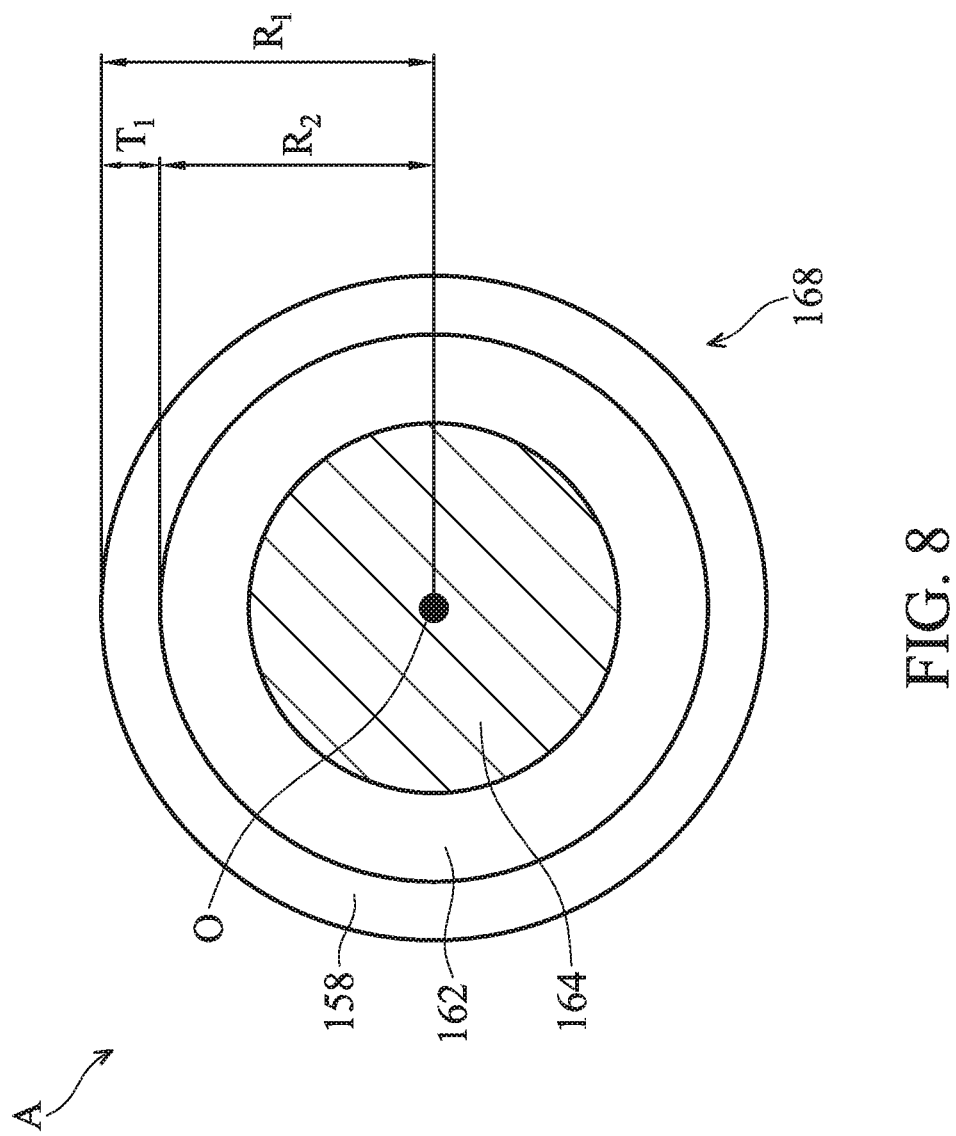
FIG. 8 shows an enlarged cross-sectional representation of region A of FIG. 7, in accordance with some embodiments of the disclosure.

FIG. 8 shows an enlarged cross-sectional representation of region A of FIG. 7, in accordance with some embodiments of the disclosure.

As shown in FIG. 8, as mentioned above, the first isolation layer 156 and the second isolation layer 158 respectively has the thickness $T_1$. There is a middle point O in the middle of the gate contact structure 168. There is a first radius $R_1$ between the middle point O and the outer surface of the second isolation layer 158. There is a second radius $R_2$ between the middle point O and outer surface of the gate contact structure 168. The difference between the first radius $R_1$ and the second radius $R_2$ is the thickness $T_1$ of the second isolation layer 158. In some embodiments, the thickness $T_1$ is in a range from about 1 nm to about 3 nm. In some embodiments, the first radius $R_1$ is in a range from about 6 nm to about 11 nm. In some embodiments, a ratio of the thickness $T_1$ to the first radius $R_1$ is in a range from about 9% to about 50%. It should be note that the second recess 153 (shown in FIG. 2C) has a high aspect ratio. If the ratio is not within above-mentioned range, the filling materials (such as barrier layer 162, the second conductive layer 164) are difficult to fill into the second recess 153.

Embodiments for forming a FinFET device structure and method for formation the same are provided. The FinFET device structure includes a fin structure formed over a substrate, and a gate structure formed over the fin structure. AN S/D structure is formed adjacent to the gate structure, and an S/D contact structure is formed on the S/D structure. AN S/D conductive plug is formed over and electrically connected to the S/D contact structure. A gate contact structure is formed on and electrically connected to the gate structure. A first isolation layer is formed surrounding the S/D conductive plug, and a second isolation layer is formed surrounding the gate contact structure. The current leakage problem is prevented by forming the first isolation layer and the second isolation layer between the S/D conductive plug and the gate contact structure. Therefore, the performance of the FinFET device structure is reduced.

In some embodiments, a FinFET device structure is provided. The FinFET device structure includes a gate structure formed over a fin structure and an S/D contact structure formed over the fin structure. The FinFET device structure also includes an S/D conductive plug formed over the S/D contact structure, and the S/D conductive plug includes a first barrier layer and a first conductive layer. The FinFET device structure further includes a gate contact structure formed over the gate structure, and the gate contact structure includes a second barrier layer and a second conductive layer. The FinFET device structure also includes a first isolation layer surrounding the S/D conductive plug, and the first barrier layer is between the first isolation layer and the first conductive layer. The FinFET device structure includes a second isolation layer surrounding the gate contact structure, and the second barrier layer is between the second isolation layer and the second conductive layer.

In some embodiments, a FinFET device structure is provided. The FinFET device structure includes a fin structure formed over a substrate and a gate structure formed over the fin structure. The FinFET device structure also includes an S/D contact structure formed adjacent to the gate structure and an S/D conductive plug formed over the S/D contact structure. The S/D conductive plug is electrically connected to the S/D contact structure. The FinFET device structure further includes a first isolation layer formed on a sidewall surface of the S/D conductive plug, and the first isolation layer is made of high-k dielectric material. The FinFET device structure includes a gate contact structure formed over the gate structure, and the gate contact structure is electrically connected to the gate structure. The FinFET device structure includes a second isolation layer formed on a sidewall surface of the gate contact structure, and the second isolation layer is made of high-k dielectric material.

In some embodiments, a method for forming a FinFET device structure is provided. The method includes forming a gate structure over a fin structure and forming an S/D contact structure adjacent to the gate structure. The method includes forming a dielectric layer over the gate structure and the S/D contact structure and forming a first recess and a second recess in the dielectric layer. The first recess is above the S/D contact structure, and the second recess is above the gate structure. The method also includes forming a first isolation layer on sidewall surfaces of the first recess and a second isolation layer on sidewall surfaces of the second recess. The method includes forming an S/D conductive plug over the first isolation layer, and the S/D conductive plug includes a first barrier layer and a first conductive layer, and the first barrier layer is between the first isolation layer and the first conductive layer. The method includes forming a gate contact structure over the second isolation layer, and the gate contact structure includes a second barrier layer and a second conductive layer, and the second barrier layer is between the second isolation layer and the second conductive layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A fin field effect transistor (FinFET) device structure, comprising:
   a gate structure formed over a fin structure, wherein the gate structure comprises a gate dielectric layer;
   a source/drain (S/D) contact structure formed over the fin structure;
   an S/D conductive plug formed over the S/D contact structure, wherein the S/D conductive plug comprises a first barrier layer and a first conductive layer, wherein the first barrier layer is in direct contact with the S/D contact structure;
   a gate contact structure formed over the gate structure, wherein the gate contact structure comprises a second barrier layer and a second conductive layer;
   a first dielectric layer over the gate structure;
   an etching stop layer over the first dielectric layer;
   a second dielectric layer over the etching stop layer;
   a first isolation layer surrounding the S/D conductive plug, wherein the first barrier layer is between the first isolation layer and the first conductive layer; and
   a second isolation layer surrounding the gate contact structure, wherein the second barrier layer is between the second isolation layer and the second conductive layer, and a bottom surface of the second isolation layer is lower than a top surface of the gate dielectric layer,
   wherein a top surface of the etching stop layer is higher than the bottom surface of the second isolation layer and lower than a top surface of the first isolation layer, and
   wherein the second isolation layer is in direct contact with the gate dielectric layer at a location below the top surface of the gate dielectric layer, and continuously extends from the location below the top surface of the gate dielectric layer to a top surface of the second dielectric layer and above the top surface of the gate dielectric layer.

2. The fin field effect transistor (FinFET) device structure as claimed in claim 1, further comprising:
   an S/D structure formed over the fin structure;
   a metal silicide layer formed on the S/D structure; and
   the S/D contact structure formed over the metal silicide layer, wherein the S/D structure is electrically connected to the S/D contact structure by the metal silicide layer.

3. The fin field effect transistor (FinFET) device structure as claimed in claim 1, wherein a bottom surface of the first isolation layer is higher than the bottom surface of the second isolation layer.

4. The fin field effect transistor (FinFET) device structure as claimed in claim 3, wherein the first barrier layer is formed on sidewall surfaces and on the top surface of the first isolation layer.

5. The fin field effect transistor (FinFET) device structure as claimed in claim 1, wherein the gate structure is formed in a third dielectric layer, and a dielectric constant of the first isolation layer is greater than a dielectric constant of the third dielectric layer.

6. The fin field effect transistor (FinFET) device structure as claimed in claim 1, wherein the first isolation layer and the second isolation layer are made of high-k dielectric materials.

7. The fin field effect transistor (FinFET) device structure as claimed in claim 1, wherein the gate structure comprises a work function layer over a gate dielectric layer and a gate electrode layer formed over the work function layer, and the second isolation layer is in direct contact with the work function layer and the gate electrode layer.

8. The fin field effect transistor (FinFET) device structure as claimed in claim 1, wherein a first bottom width of the S/D conductive plug is smaller than a second bottom width of the gate contact structure.

9. The fin field effect transistor (FinFET) device structure as claimed in claim 1, wherein a bottom surface of the etching stop layer is aligned with the bottom surface of the first isolation layer.

10. A fin field effect transistor (FinFET) device structure, comprising:
    a fin structure formed over a substrate;
    a gate structure formed over the fin structure, wherein the gate structure comprises a gate dielectric layer and a gate electrode layer, wherein a topmost surface of the gate dielectric layer is higher than a topmost surface of the gate electrode layer;

an S/D contact structure formed adjacent to the gate structure;

an S/D conductive plug formed over the S/D contact structure, wherein the S/D conductive plug is electrically connected to the S/D contact structure;

a first isolation layer formed on a sidewall surface of the S/D conductive plug, wherein the first isolation layer is made of high-k dielectric material;

a gate contact structure formed over the gate structure, wherein the gate contact structure is electrically connected to the gate structure, and the gate contact structure comprises a second barrier layer, and the second barrier layer is in direct contact with the gate electrode layer; and a first dielectric layer over the gate structure;

an etching stop layer over the first dielectric layer;

a second dielectric layer over the etching stop layer;

a second isolation layer formed on a sidewall surface of the gate contact structure, wherein the second isolation layer is made of high-k dielectric material, wherein a top surface of the etching stop layer is higher than a bottom surface of the second isolation layer and lower than a top surface of the first isolation layer, and wherein the second isolation layer is in direct contact with the gate dielectric layer at a location below the top surface of the gate dielectric layer, and continuously extends from the location below the top surface of the gate dielectric layer to a top surface of the second dielectric layer and above the top surface of the gate dielectric layer.

11. The fin field effect transistor (FinFET) device structure as claimed in claim 10, wherein a bottom surface of the first isolation layer is higher than a bottom surface of the second isolation layer.

12. The fin field effect transistor (FinFET) device structure as claimed in claim 10, wherein a first bottom width of the S/D conductive plug is smaller than a second bottom width of the gate contact structure.

13. The fin field effect transistor (FinFET) device structure as claimed in claim 10, wherein the S/D conductive plug comprises a U-shaped barrier layer and a conductive via, wherein the U-shaped barrier layer is between the first isolation layer and the conductive via.

14. The fin field effect transistor (FinFET) device structure as claimed in claim 13, wherein the barrier layer is formed on sidewall surfaces and on the top surface of the first isolation layer.

15. The fin field effect transistor (FinFET) device structure as claimed in claim 10, wherein the gate electrode layer is formed over the gate dielectric layer, and the bottom surface of the second isolation layer is lower than the topmost surface of the gate dielectric layer.

16. The fin field effect transistor (FinFET) device structure as claimed in claim 10, wherein a bottom surface of the etching stop layer is aligned with the bottom surface of the first isolation layer.

17. A method for a fin field effect transistor (FinFET) device structure, comprising:
forming a gate structure over a fin structure, wherein the gate structure comprises a gate dielectric layer;
forming an S/D contact structure adjacent to the gate structure;
forming a dielectric layer over the gate structure and the S/D contact structure;
forming a first recess and a second recess in the dielectric layer, wherein the first recess is above the S/D contact structure, and the second recess is above the gate structure;
forming a first isolation layer on sidewall surfaces of the first recess;
forming a second isolation layer on sidewall surfaces of the second recess, wherein the second isolation layer is in direct contact with the gate dielectric layer at a location below the top surface of the gate dielectric layer, and continuously extends from the location below the top surface of the gate dielectric layer to a top surface of the dielectric layer and above the top surface of the gate dielectric layer;
forming a barrier layer over the first isolation layer and the second isolation layer, wherein the barrier layer is in direct contact with the dielectric layer;
forming an S/D conductive plug over the first isolation layer, wherein the S/D conductive plug comprises the barrier layer and a first conductive layer, and the barrier layer is between the first isolation layer and the first conductive layer; and
forming a gate contact structure over the second isolation layer, wherein the gate contact structure comprises the barrier layer and a second conductive layer, and the barrier layer is between the second isolation layer and the second conductive layer.

18. The method for forming fin field effect transistor (FinFET) device structure as claimed in claim 17, further comprising:
forming the barrier layer in the first recess and the second recess;
forming a conductive material over the barrier layer to form the S/D conductive plug over the S/D contact structure and the gate contact structure over the gate structure.

19. The method for forming fin field effect transistor (FinFET) device structure as claimed in claim 17, wherein the barrier layer is in direct contact with first conductive layer at a second location below the top surface of the gate dielectric layer, and continuously extends from the second location below the top surface of the gate dielectric layer to the top surface of the dielectric layer and above the top surface of the gate dielectric layer.

20. The method for forming fin field effect transistor (FinFET) device structure as claimed in claim 17, wherein the gate structure further comprises a work function layer, and the second isolation layer is in direct contact with the work function layer at a third location below the top surface of the gate dielectric layer.

* * * * *